(12) United States Patent
Umeda

(10) Patent No.: US 8,791,698 B2
(45) Date of Patent: Jul. 29, 2014

(54) MRI APPARATUS AND MRI METHOD

(75) Inventor: Masaaki Umeda, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 488 days.

(21) Appl. No.: 13/223,772

(22) Filed: Sep. 1, 2011

(65) Prior Publication Data

US 2011/0316537 A1    Dec. 29, 2011

Related U.S. Application Data

(63) Continuation of application No. 12/400,223, filed on Mar. 9, 2009, now Pat. No. 8,253,415.

(30) Foreign Application Priority Data

Mar. 10, 2008    (JP) ................................. 2008-060121

(51) Int. Cl.
*G01V 3/00*    (2006.01)

(52) U.S. Cl.
USPC .......................................... 324/307; 324/309

(58) Field of Classification Search
USPC ........................... 324/300–322; 600/409–445
See application file for complete search history.

(56) References Cited

U.S. PATENT DOCUMENTS

| | | | |
|---|---|---|---|
| 5,894,221 A * | 4/1999 | Watanabe et al. ............. 324/307 |
| 7,200,430 B2 | 4/2007 | Thomas et al. |
| 7,505,805 B2 | 3/2009 | Kuroda |
| 7,709,266 B2 | 5/2010 | Mayer et al. |
| 8,035,381 B2 * | 10/2011 | Lustig et al. ................... 324/309 |
| 8,253,415 B2 * | 8/2012 | Umeda .......................... 324/307 |
| 2003/0208120 A1 * | 11/2003 | Thomas et al. ............... 600/410 |
| 2009/0179642 A1 * | 7/2009 | deCharms ...................... 324/309 |
| 2009/0224761 A1 * | 9/2009 | Umeda .......................... 324/312 |
| 2011/0316537 A1 * | 12/2011 | Umeda .......................... 324/310 |

FOREIGN PATENT DOCUMENTS

| | | |
|---|---|---|
| JP | 54-131991 | 10/1979 |
| JP | 02-236475 | 9/1990 |
| JP | 03-085143 | 4/1991 |
| JP | 04-200532 | 7/1992 |
| JP | 04-226634 | 8/1992 |
| JP | 08-191816 | 7/1996 |
| JP | 10-090386 | 4/1998 |
| JP | 11-513602 | 11/1999 |
| JP | 2000-014657 | 1/2000 |
| WO | 2005/000116 A1 | 1/2005 |

OTHER PUBLICATIONS

JP Office Action dated May 21, 2013 in JP 2009-054481.

* cited by examiner

*Primary Examiner* — Brij Shrivastav
(74) *Attorney, Agent, or Firm* — Nixon & Vanderhye PC

(57) ABSTRACT

A magnetic resonance imaging apparatus includes a spectrum acquisition unit and a determining unit. The spectrum acquisition unit acquires a frequency spectrum of magnetic resonance signals from a metabolic product in a target region in an object. The determining unit determines the number of (a) integrations and/or (b) phase encodes of magnetic resonance signals for obtaining the frequency spectrum depending on a factor influencing the frequency spectrum.

9 Claims, 17 Drawing Sheets

(A)

(B)

MRI APPARATUS AND MRI METHOD

CROSS-REFERENCE TO RELATED APPLICATIONS

This application is a continuation of co-pending, commonly assigned application Ser. No. 12/400,223 filed Mar. 9, 2009, which claims priority based on Japanese Patent Application No. JP 2008-060121 filed Mar. 10, 2008, the entire contents of both of which are incorporated herein by reference.

BACKGROUND OF THE INVENTION

1. Field of the Invention

The present invention relates to an MRI (magnetic resonance imaging) apparatus and a magnetic resonance imaging method which excite nuclear spins of an object magnetically with an RF (radio frequency) signal having the Larmor frequency and reconstruct an image based on NMR (nuclear magnetic resonance) signals generated due to the excitation and, more particularly, to a magnetic resonance imaging apparatus and a magnetic resonance imaging method which make it possible to acquire a frequency spectrum of magnetic resonance signals from a metabolic product in the object by MRS (Magnetic Resonance Spectroscopy).

2. Description of Related Art

Magnetic Resonance Imaging is an imaging method which excites nuclear spins of an object set in a static magnetic field with an RF signal having the Larmor frequency magnetically and reconstructs an image based on NMR signals generated due to the excitation.

In recent years, $^1$H-MRS is performed as an efficient means for early diagnosis of disease (especially, determination of the extent of a tumor). $^1$H-MRS uses a magnetic resonance phenomenon to observe a frequency spectrum of magnetic resonance signals from a minute metabolite containing $^1$H nuclei in a living body, and can observe NAA (N-acetylaspartate), Cho (choline), PCr/Cr (creatine phosphate/creatine), Glx (glutamic acid and glutamine), Lac (lactic acid), ml (myo-inositol) and the like. The concentration of a proton metabolite such as NAA in a living body is small by about quadruple digits compared to that of biological water and metabolites distribute within 5 ppm. Therefore, it is important in the $^1$H-MRS to properly set the voxel size to be an MRS target and the number-of-times-of-integration of echo signals for generating a spectrum so as to acquire a spectrum having narrow line widths with an improved S/N (signal to noise) ratio. The same applies to another MRS such as $^{31}$P-MRS and $^{13}$C-MRS.

Note that, as the related art of MRS, a technique has been known that alternatively performs plural pulse sequences for acquiring magnetic resonance data with regard to the concentrations of labeled glucose, unlabeled glucose, labeled compound and unlabeled compound (see, for example, Japanese Patent Application (Laid-Open disclosure) No. 2000-14657). According to this technique, the metabolic rates of glucose and its compound can be measured without blood sampling, which is very burdensome for the object.

However, the voxel size and the number-of-times-of-integration had been conventionally set depending on experience of an operator although it is important to properly set the voxel size and the number-of-times-of-integration in MRS as described above, Accordingly, it is difficult to properly set the voxel size and the number-of-times-of-integration when the sensitivity of the RF coil or the susceptibility of the object is not uniform. As a result, an actual examination may result in failure due to a body motion or an examination time may increase unnecessarily. Accordingly, there is an issue of unnecessarily increasing an examination time.

These problems can not be solved even by the above-described conventional technology.

SUMMARY

The present invention has been made in light of the conventional situations, and it is an object of the present invention to provide a magnetic resonance imaging apparatus and a magnetic resonance imaging method which make it possible to save useless examination time by MRS satisfactorily.

The present invention provides a magnetic resonance imaging apparatus comprising: a spectrum acquisition unit configured to acquire a frequency spectrum of magnetic resonance signals from a metabolic product in a target region in an object by applying radio frequency pulses and gradient magnetic field pulses to the object in a static magnetic field; and a determining unit configured to determine one of the number of times of integrations and the number of times of phase encodes of magnetic resonance signals for obtaining the frequency spectrum depending on a factor influencing the frequency spectrum, in an aspect to achieve the object.

The present invention also provides a magnetic resonance imaging apparatus comprising: a spectrum acquisition unit configured to acquire a frequency spectrum of magnetic resonance signals from a metabolic product in a target region in an object by applying radio frequency pulses and gradient magnetic field pulses to the object in a static magnetic field; and an acquisition condition changing unit configured to change an acquisition condition of the frequency spectrum during acquiring the frequency spectrum, in an aspect to achieve the object.

The present invention also provides a magnetic resonance imaging method comprising: acquiring a frequency spectrum of magnetic resonance signals from a metabolic product in a target region in an object by applying radio frequency pulses and gradient magnetic field pulses to the object in a static magnetic field; and determining one of the number of times of integrations and the number of times of phase encodes of magnetic resonance signals for obtaining the frequency spectrum depending on a factor influencing the frequency spectrum, in an aspect to achieve the object.

The present invention also provides a magnetic resonance imaging method comprising: acquiring a frequency spectrum of magnetic resonance signals from a metabolic product in a target region in an object by applying radio frequency pulses and gradient magnetic field pulses to the object in a static magnetic field; and changing an acquisition condition of the frequency spectrum during acquiring the frequency spectrum, in an aspect to achieve the object.

The magnetic resonance imaging apparatus and the magnetic resonance imaging method according to the present invention as described above make it possible to save useless examination time by MRS satisfactorily.

DESCRIPTION OF THE PREFERRED EMBODIMENTS

A magnetic resonance imaging apparatus and a magnetic resonance imaging method according to embodiments of the present invention will be described with reference to the accompanying drawings.

1. First Embodiment (Configuration and Function)

Figure 1:
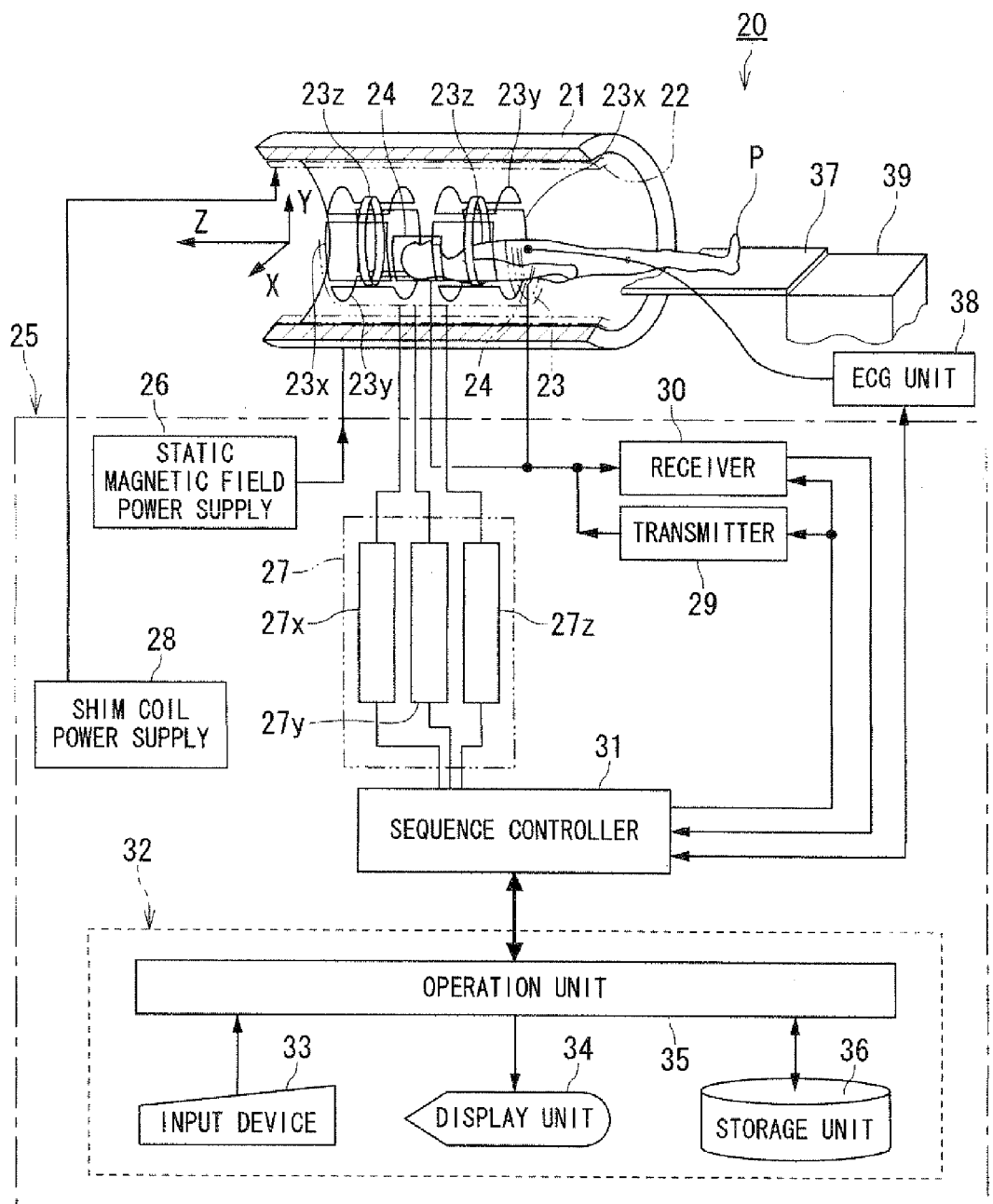
FIG. 1 is a block diagram showing a magnetic resonance imaging apparatus according to a first embodiment of the present invention.

FIG. 1 is a block diagram showing a magnetic resonance imaging apparatus according to a first embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has a cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped are arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 of the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27, respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z, respectively, so as to generate gradient magnetic fields Gx, Gy and Gz in the X, Y and Z directions in the imaging area.

The RF coils 24 communicate with the transmitter 29 and/or the receiver 30. The transmission RF coil 24 has a function to transmit an RF signal given from the transmitter 29 to the object P. The reception RF coil 24 has a function to receive an MR signal generated due to a nuclear spin inside the object P which is excited by the RF signal to give to the receiver 30.

Figure 2:
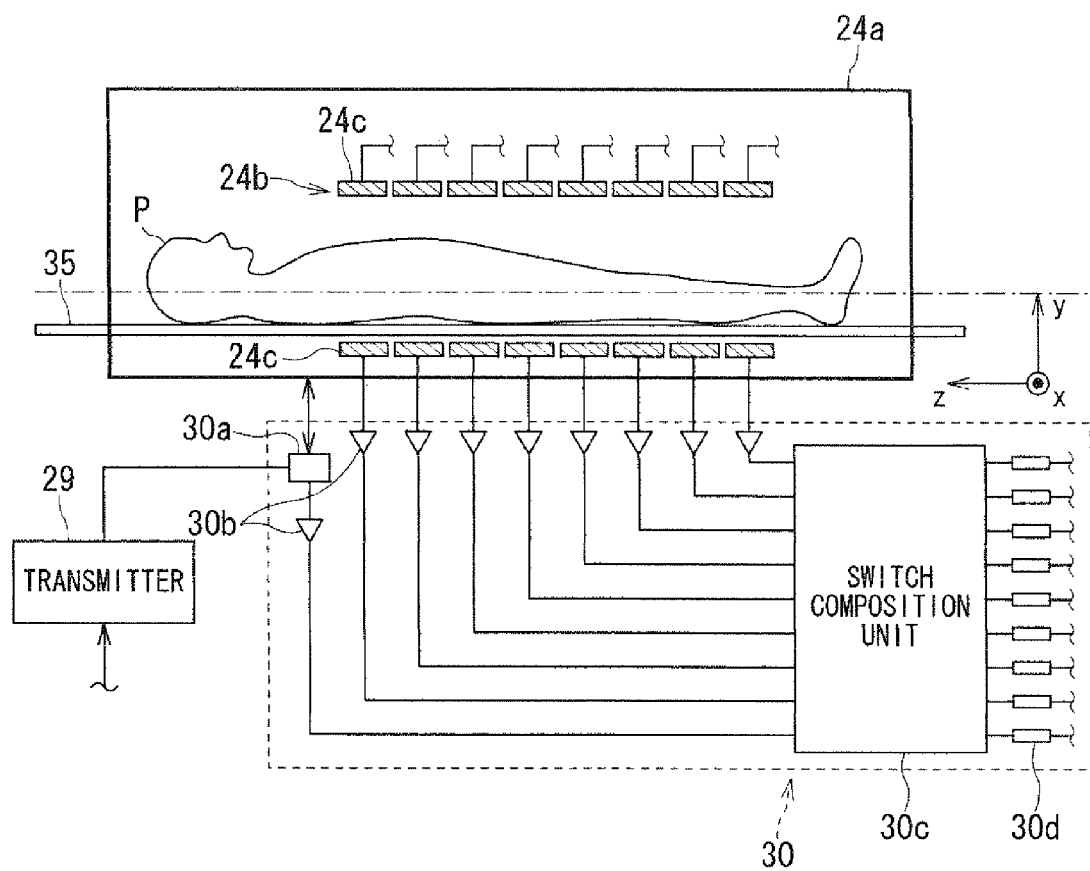
FIG. 2 is a diagram showing an example of detail structure of the RF coil shown in FIG. 1.
Figure 3:
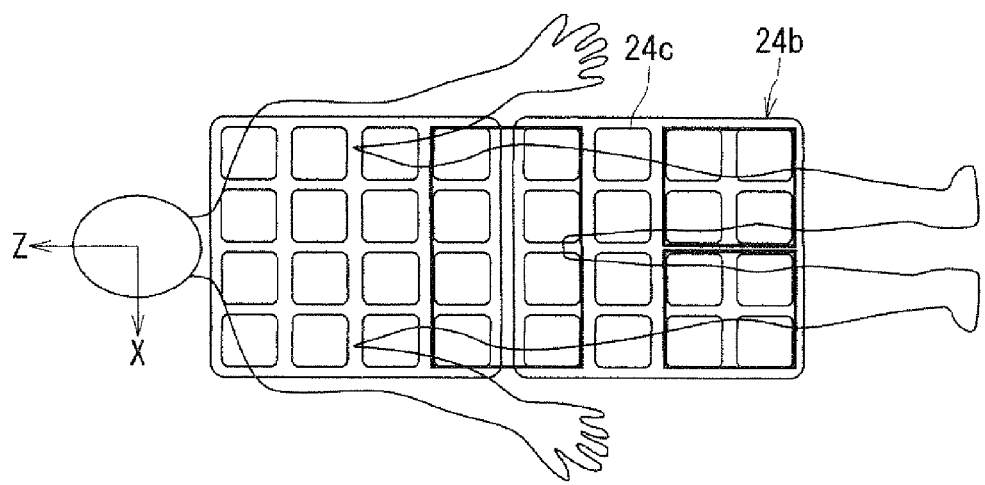
FIG. 3 is a diagram showing an example arrangement of the surface coils set on the body surface side of the object shown in FIG. 2.
Figure 4:
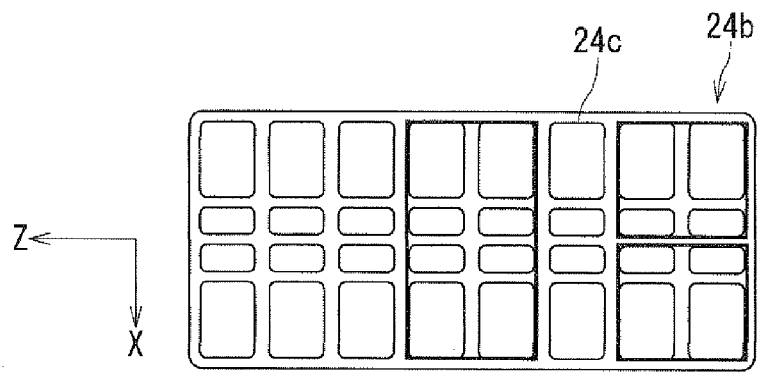
FIG. 4 is a diagram showing an example arrangement of the surface coils set on the back surface side of the object shown in FIG. 2.

FIG. 2 is a diagram showing an example of detail structures of the RF coils 24 shown in FIG. 1. FIG. 3 is a diagram showing an example arrangement of the surface coils 24c set on the body surface side of the object P shown in FIG. 2. FIG. 4 is a diagram showing an example arrangement of the surface coils 24c set on the back surface side of the object P shown in FIG. 2.

As shown in FIG. 2, the RF coils 24 include a cylindrical WB (whole-body) coil 24a, and a phased array coil 24b. The phased array coil 24b includes a plurality of surface coils 24c, and a plurality of the surface coils 24c is arranged on each of the body surface side and the back surface side of the object P.

For example, as shown in FIG. 3, on the body surface side of the object P, four rows of surface coils 24c are provided in the x-direction and eight columns of them in the z-direction, that is, a total of thirty-two surface coils 24c are arranged so as to cover a wide-ranging imaging area. Likewise, as shown in FIG. 4, on the back surface side of the object, four rows of surface coils 24c are provided in the x-direction and eight columns of them in the z-direction, that is, a total of thirty-two surface coils 24c are arranged so as to cover a wide-ranging imaging area. On the back surface side, surface coils 24 with a smaller size than that of the other surface coils 24c are arranged in the vicinity of the body axis from the viewpoint of sensitivity improvement, considering for the presence of the backbone of the object P.

On the other hand, the receiver 30 includes a duplexer 30a, amplifiers 30b, a switch composition unit 30c, and reception circuits 30d. The duplexer 30a is connected to the transmitter 29, the WB coil 24a, and the amplifier 30b for the WB coil 24a. The amplifiers 30b are provided by the total number of the surface coils 24c and the WB coil 24a, and each connected to a respective one of the surface coils 24c and the WB coil 24a. The switch composition unit 30c consists of a single piece or a plurality of pieces. The input side of the switch composition unit 30c is connected to the plurality of surface coil units 24c or the WB coil 24a through the plurality of amplifiers 30b. The reception circuits 30d are provided by a desired number such as to be smaller than or equal to the total number of the surface coils 24c and the WB coil 24a, and disposed on the output side of the switch composition unit 30c.

The WB coil 24a can be used as a coil for the transmission of radio frequency signals. As a coil for the reception of NMR signals, each of the surface coils 24c, can be used. Furthermore, the WB coil 24a can also be used as a receiving coil.

Therefore, the duplexer 30a is configured so as to provide the WB coil 24a with radio frequency signals for transmission, outputted from the transmitter 29, while providing the switch composition unit 30c with NMR signals received in the WB coil 24a via the amplifiers 30b in the receiver 30. An NMR signal received in each of the surface coils 24c is outputted to the switch composition unit 30c via a respective one of the amplifiers 30b.

The switch composition unit 30c is configured so as to perform composition processing and switching with respect to NMR signals received from the surface coils 24c or the WB coil 24a and to output them to the corresponding reception circuits 30d. In other words, the switch composition unit 30c is configured so that, in conformance with the number of the reception circuits 30d, the composition processing and switching with respect to NMR signals received from the surface coils 24c or the WB coil 24a are performed in the switch composition unit 30c, and that NMR signals can be received from various imaging areas by forming sensibility distributions in response to the imaging areas, using a plurality of desired surface coils 24c.

However, NMR signals may be received by WB coil 24a alone without providing the surface coils 24c. Also, NMR signals received in the surface coils 24c or the WB coil 24a may be directly outputted to the reception circuits 30d without providing the switch composition unit 30c. Furthermore, more surface coils 24c may be extensively arranged.

Figure 5:
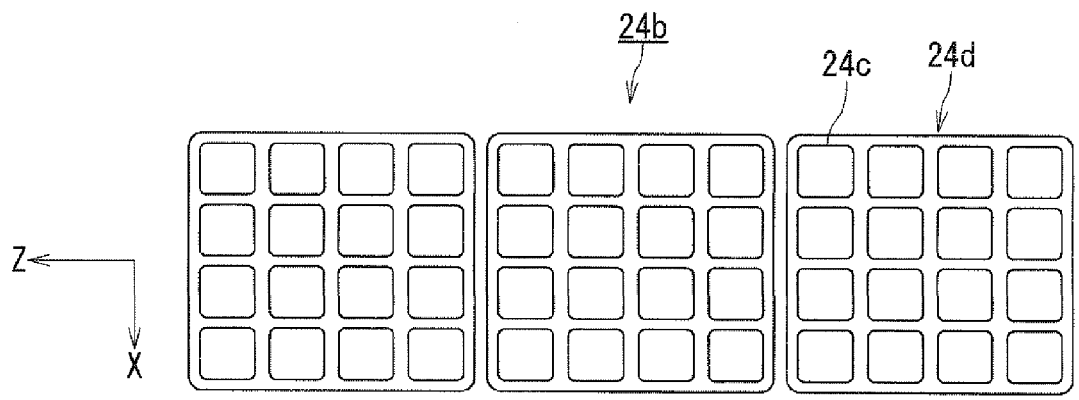
FIG. 5 is a diagram showing another example arrangement of the surface coils set on the body surface side of the object shown in FIG. 2.
Figure 6:
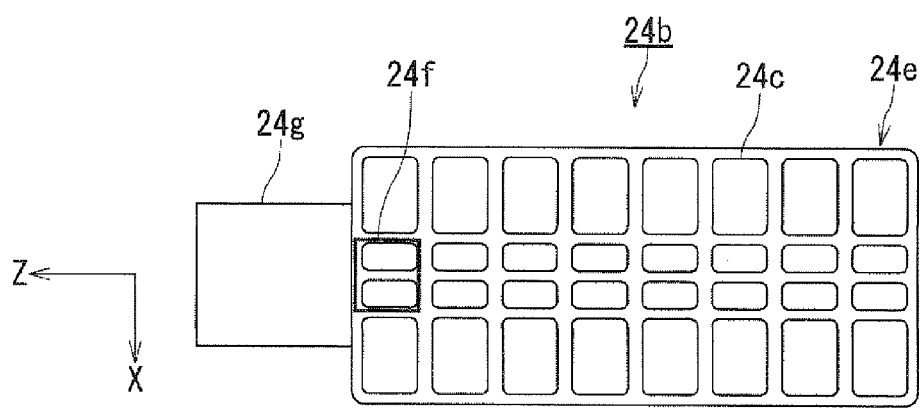
FIG. 6 is a diagram showing another example arrangement of the surface coils set on the back surface side of the object shown in FIG. 2.

FIG. 5 is a diagram showing another example arrangement of the surface coils 24c set on the body surface side of the object P shown in FIG. 2. FIG. 6 is a diagram showing another example arrangement of the surface coils 24c set on the back surface side of the object P shown in FIG. 2.

As shown in FIGS. 5 and 6, further more surface coils 24c may be arranged around the object P. In an example shown in FIG. 5, three coil units 24d, each composed of sixteen elements constituted of four columns of surface coils 24c in the x-direction and four rows of surface coils 24c in the z-direction, are arranged in the z-direction, that is, a total of forty-eight elements of surface coils 24c are arranged on the body surface side of the object P. On the other hand, in an example shown in FIG. 6, a coil unit 24e composed of thirty-two elements constituted of four columns of surface coils 24c in the x-direction and eight rows of surface coils 24c in the z-direction are arranged on the backbone side of the object P; a coil units 24f having surface coils 24c composed of two elements (not shown) are arranged in the vicinity of jaws; and further a coil unit 24g having surface coils 24c composed of twelve elements (not shown) are arranged under the head, that is, a total of forty-six elements of surface coils 24c are arranged on the back surface side of the object P. Arranging the surface coils 24c on the body surface side and back surface side of the object P as shown in FIGS. 5 and 6 results in that a total of ninety-four elements of surface coils 24c are arranged around the object P. Each of the surface coils 24c is connected to a respective exclusive one of the amplifiers 30b via a coil port (not shown).

Arranging a multitude of surface coils 24c around the object P makes it possible to form a phased array coil 24b for the whole-body, capable of receiving data from a plurality of imaging areas without moving the positions of the coils or that of the object P. Although the WB coil 24a can also receive data from a plurality of imaging areas without moving the positions of the coils or that of the object P, the use of the phased array coil 24b as a receiving coil allows data to be received with sensitivities more suitable for the imaging areas and with a better signal-to-noise ratio (SNR).

The sequence controller 31 of the control system 25 communicates with the gradient power supply 27, the transmitter 29 and the receiver 30. The sequence controller 31 has a function to store sequence information describing control information needed in order to make the gradient power supply 27, the transmitter 29 and the receiver 30 drive and generate gradient magnetic fields Gx, Gy and Gz in the X, Y and Z directions and an RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27.

The sequence controller 31 is also configured to give raw data to the computer 32. The raw data is complex data obtained through the detection of an NMR signal and A/D conversion to the NMR signal detected in the receiver 30.

The transmitter 29 has a function to give an RF signal to the RF coil 24 in accordance with control information provided from the sequence controller 31. The receiver 30 has a function to generate raw data which is digitized complex number data by detecting an MR signal given from the RF coil 24 and performing predetermined signal processing and A/D converting to the MR signal detected. The receiver 30 also has a function to give the generated raw data to the sequence controller 31.

The computer 32 gets various functions by the operation unit 35 executing some programs stored in the storage unit 36 of the computer 32. Alternatively, some specific circuits having various functions may be provided with the magnetic resonance imaging apparatus 20 instead of using some of the programs.

In addition, an ECG unit 38 for acquiring an ECG signal of the object P is provided with the magnetic resonance imaging apparatus 20. The ECG signal detected by the ECG unit 38 is outputted to the computer 32 through the sequence controller 31.

Furthermore, the bed 37 is provided with a table drive unit 39. The table drive unit 39 is connected with the computer 32 so as to move the table of the bed 37 under the control by the computer 32 for imaging with a moving table method or a stepping table method. The moving table method is a technique for obtaining a large FOV (field of view) in a moving direction by continuously moving the table of the bed 37 during imaging. The stepping table method is a technique for three-dimensional imaging at every station by stepping the table of the bed 37. These techniques are used in case of imaging a large area which is unable to be imaged at a time such as whole body imaging. The images acquired with moving the bed 37 may be combined mutually by compound processing in the computer 32.

Figure 7:
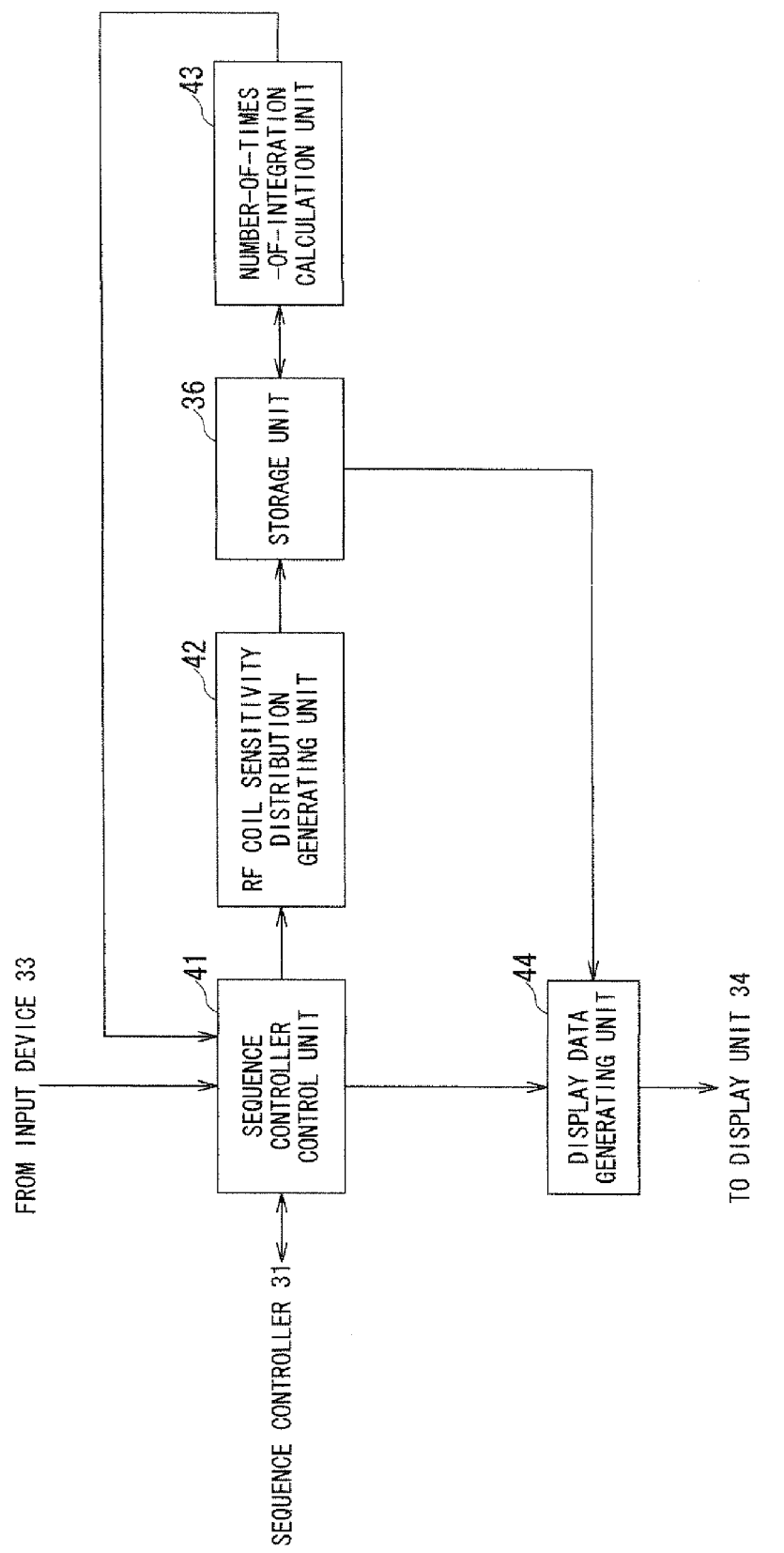
FIG. 7 is a functional block diagram of the computer shown in FIG. 1.

FIG. 7 is a functional block diagram of the computer 32 shown in FIG. 1.

The computer 32 functions as a sequence controller control unit 41, an RF coil sensitivity distribution generating unit 42, a number-of-times-of-integration calculating unit 43 and a display data generating unit 44.

The sequence controller control unit 41 controls drive of the sequence controller 31 overall based on various information inputted by the operation of the input device 33 by an operator. The sequence controller control unit 41 provides a sequence for EPI (Echo Planar Imaging), PI (Parallel Imaging) that is imaging using the phased array coil 24b, imaging under a gradient echo method or the like to the sequence controller 31 so that to the sequence controller 31 performs a dynamic scan.

PI is an imaging method for reducing the number of the phase encodes necessary for image reconstruction by receiving echo data with plural surface coils 24c and skipping phase encodes. When PI is performed, information including the number of surface coils 24c for acquiring echo data and information associating each surface coil 24c with an imaging part necessary for PI is set as an imaging condition.

In addition, the sequence controller control unit 41 provides a sequence for $^1$H-MRS in a desired MRS target region (MRS acquisition region) to the sequence controller 31 so that the sequence controller 31 performs an MRS. Of course, the sequence controller control unit 41 can make the sequence controller 31 perform a sequence for $^{31}$P-MRS or $^{13}$C-MRS.

The RF coil sensitivity distribution generating unit 42 acquires raw data provided through the sequence controller control unit 41 from the sequence controller 31 and arranges the acquired raw data in k-space (Fourier space), and also generates an RF coil sensitivity map with regard to an RF coil 24 by performing predetermined signal processing of the arranged raw data, Then, the RF coil sensitivity distribution generating unit 42 generates an RF coil sensitivity distribution indicating a change in signal intensity in an encode direction based on each signal intensity on the generated RF coil sensitivity map, and provides data including the generated RF coil sensitivity distribution to the storage unit 36.

Note that, in case of performing an MRS by PI, an RF coil sensitivity distribution is generated for each surface coil 24c and data including RF coil sensitivity distributions corresponding to surface coils 24c is stored in the storage unit 36.

The number-of-times-of-integration calculation unit 43 retrieves data including the RF coil sensitivity distribution stored in the storage unit 36, calculates the appropriate number-of-times-of-integration, of echo signals for generating a spectrum, corresponding to a size of a desired MRS target region by a predetermined calculation method based on the retrieved data, including the RF coil sensitivity distribution before MRS imaging, and provides data including the calculated number-of-times-of-integration to the sequence controller control unit 41.

The display data generating unit 44 displays images acquired by scans with various sequences on the display unit 34 according to a control of the sequence controller control unit 41. Specifically, the display data generating unit 44 generates display data such as image data used for an MRS plan and a frequency spectrum acquired by an MRS and displays the generated display data on the display unit 34.

Therefore, the display data generating unit 44 has a function to acquire raw data from the sequence controller control unit 41 and arrange the raw data in k-space, and a function to reconstruct image data by image reconstruction processing including FT (Fourier transformation) of k-space data arranged in k-space. Further, the display data generating unit 44 has a function to acquire echo signals acquired according to a sequence for MRS and information indicating the number-of-times-of-integration from the sequence controller control unit 41, and generate a frequency spectrum by integrating the echo signals the number of times equal to the number-of-times-of-integration.

(Operation and Action)

Figure 8:
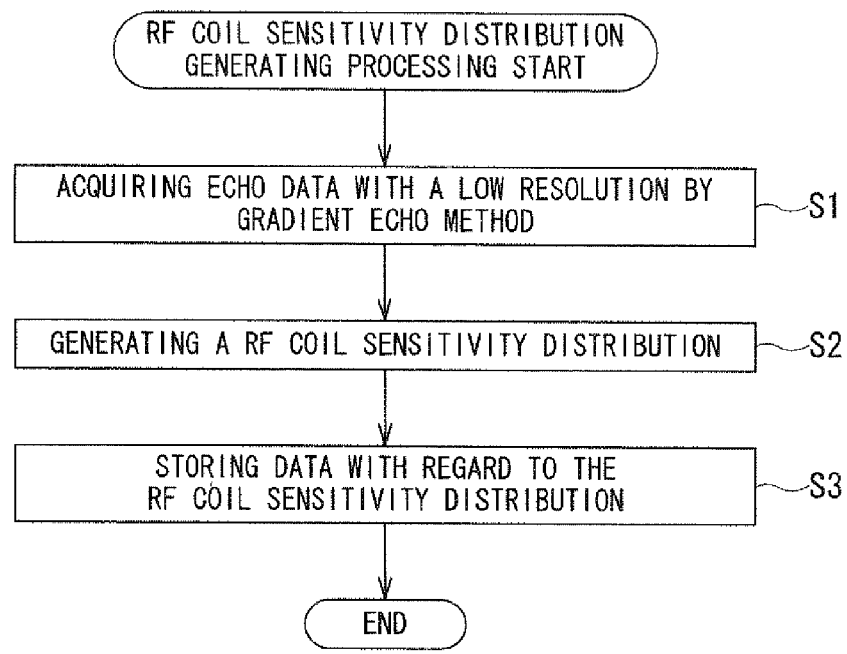
FIG. 8 is a flowchart explaining processing for generating an RF coil sensitivity distribution by the RF coil sensitivity distribution generating unit shown in FIG. 7.

FIG. 8 is a flowchart explaining processing for generating an RF coil sensitivity distribution by the RF coil sensitivity distribution generating unit 42 shown in FIG. 7.

Next, processing for generating an RF coil sensitivity distribution by the magnetic resonance imaging apparatus 20 in FIG. 7 will be described with reference to the flowchart in FIG. 8. Note that the processing for generating the RF coil sensitivity distribution is performed in advance as a preprocessing of processing for calculating the number-of-times-of-integration according to the present invention to be described below.

in step S1, the sequence controller control unit 41 controls the sequence controller 31 to make the sequence controller 31 acquire data with a low resolution (for example, data with 64 times of encodes by a gradient echo method) by a gradient echo method for sensitivity correction of the RF coil 24 before MRS imaging.

The sequence controller control unit 41 provides the raw data with the low resolution acquired by the gradient echo method to the RF coil sensitivity distribution generating unit 42.

In step S2, the RF coil sensitivity distribution generating unit 42 acquires the raw data provided through the sequence controller control unit 41 from the sequence controller 31 and arranges the acquired raw data in k-space (Fourier space), and also generates an RF coil sensitivity map of the RF coil 24 by performing known signal processing, for generating an RF coil sensitivity map, of the arranged raw data. For example, the RF coil sensitivity map can be generated by obtaining a signal intensity corresponding to each position on image data derived by image reconstruction processing of the raw data. Then, the RF coil sensitivity distribution generating unit 42 generates an RF coil sensitivity distribution indicating a change of signal intensity in an encode direction based on each signal intensity on the generated RF coil sensitivity map.

Figure 9:
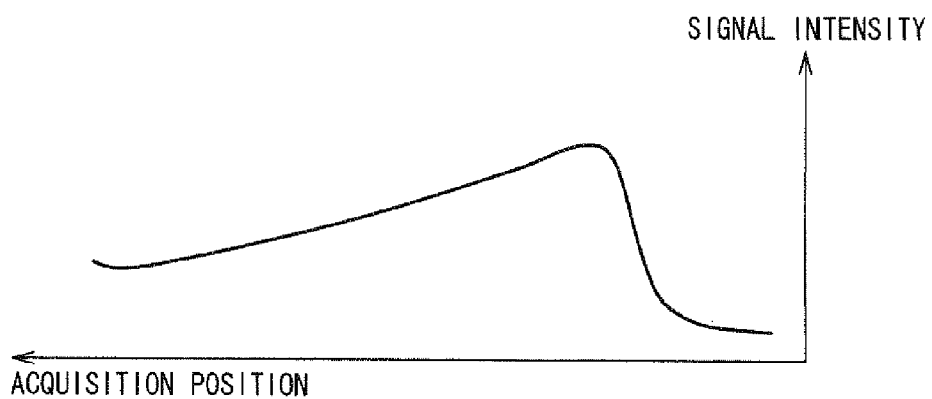
FIG. 9 is a diagram showing an RF coil sensitivity distribution generated by the RF coil sensitivity distribution generating unit shown in FIG. 7.

FIG. 9 is a diagram showing an RF coil sensitivity distribution generated by the RF coil sensitivity distribution generating unit 42 shown in FIG. 7.

As shown in FIG. 9, for example, a signal intensity corresponding to each acquisition position by the RF coil 24 is represented as a graph.

The RF coil sensitivity distribution generating unit 42 provides data including the generated RF coil sensitivity distribution to the storage unit 36.

In step S3, the storage unit 36 acquires the data including the RF coil sensitivity distribution provided from the RF coil sensitivity distribution generating unit 42, and stores the acquired data including the RF coil sensitivity distribution. The data with regard to the RF coil sensitivity distribution includes not only data indicating a signal intensity corresponding to each acquisition position, but also data indicating a voxel size used for acquiring the data for generating the RF coil sensitivity distribution and data indicating the number-of-times-of-integration of signals which are integrated for generating the RF coil sensitivity distribution, for example.

Figure 10:
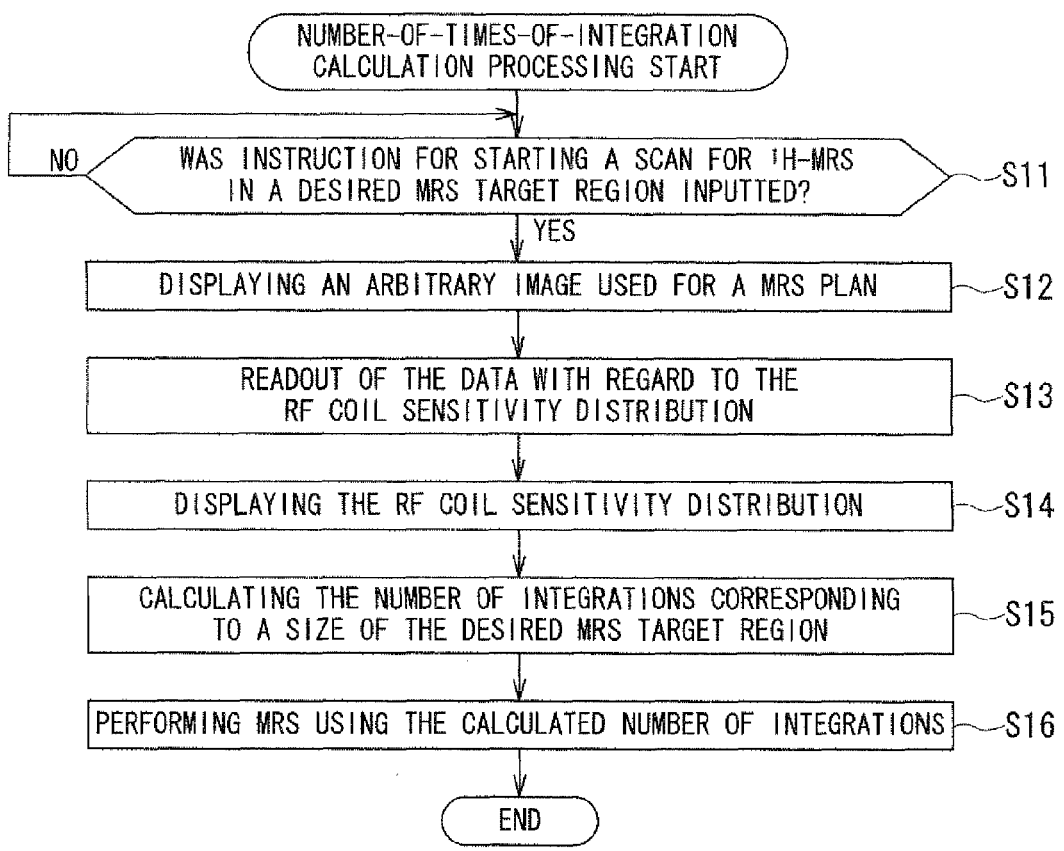
FIG. 10 is a flowchart explaining processing for calculating the number of times of integrations by the number-of-times-of-integration generating unit shown in FIG. 7.

FIG. 10 is a flowchart explaining processing for calculating the number of times of integrations by the number-of-times-of-integration calculating unit 43 shown in FIG. 7.

The processing for calculating the number-of-times-of-integration by the magnetic resonance imaging apparatus 20 in FIG. 7 will be described with reference to the flowchart of FIG. 10. The processing for calculating the number-of-times-of-integration is started before performing an MRS scan (examination) actually through an operation of the input device 33 by an operator, for example, when an instruction for starting a $^1$H-MRS scan in a desired MRS target region is received by the sequence controller control unit 41.

In step S11, the sequence controller control unit 41 determines whether an instruction for starting a $^1$H-MRS scan in a desired MRS target region is received through an operation of the input device 33 by an operator, for example, and waits until it is determined that the instruction for starting a $^1$H-MRS scan in the desired MRS target region (MRS acquisition region) is received.

In step S11, when the sequence controller control unit 41 determined that an instruction for starting a $^1$H-MRS scan in the desired MRS target region was received through an operation of the input device 33 by an operator, the sequence controller control unit 41 controls the sequence controller 31 before starting a $^1$H-MRS scan in the desired MRS target region in step S12 to acquire echo signals for generating image data used for an MRS plan and provides the acquired echo signals to the display data generating unit 44, The display data generating unit 44 acquires the echo signals, ¥ for an MRS plan image provided from the sequence controller control unit 41, and displays an MRS plan image generated by image reconstruction processing of the echo signals on the display unit 34.

Figure 11:
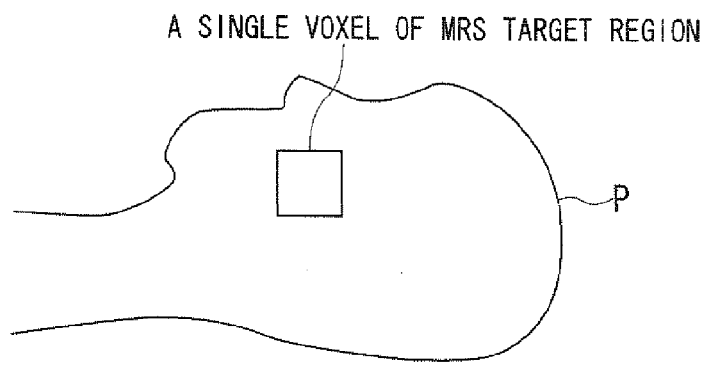
FIG. 11 is a diagram showing an example of displayed arbitrary image used for a plan on MRS.

FIG. 11 is a diagram showing an example of displayed arbitrary image used for a plan on MRS.

The display unit 34 displays an arbitrary image used for an MRS plan as shown in FIG. 11. Then, an operator can set a voxel as an MRS target region by inputting information into the sequence controller control unit 41 through an operation of the input device 33.

After setting an MRS target region, the display data generating unit 44 displays the MRS target region as a single voxel superimposed on the plan image. Note that, in a case where multi voxels were set, local excitation regions are superimposed on the plan image.

In step S13, the number-of-times-of-integration calculation unit 43 retrieves the data including the RF coil sensitivity distribution stored in the storage unit 36 before MRS imaging. The data including the RF coil sensitivity distribution includes the data indicating the signal intensity corresponding to each acquisition position, such as the signal intensity at the acquisition position at which the sensitivity is highest, and the data indicating the voxel size having been used in the data acquisition and the number-of-times-of-integration of the signals, like the voxel size N=8 (cc) and the number-of-times-of-integration (or the-number-of-times of the phase encodes) O=128.

In step S14, the display data generating unit 44 retrieves the data including the RF coil sensitivity distribution stored in the storage unit 36, for calculation processing of the number-of-times-of-integration by the number-of-times-of-integration calculation unit 43, and displays the RF coil sensitivity distribution on the display unit 34 according to the retrieved data including the RF coil sensitivity distribution by controlling the display unit 34.

Figure 12:
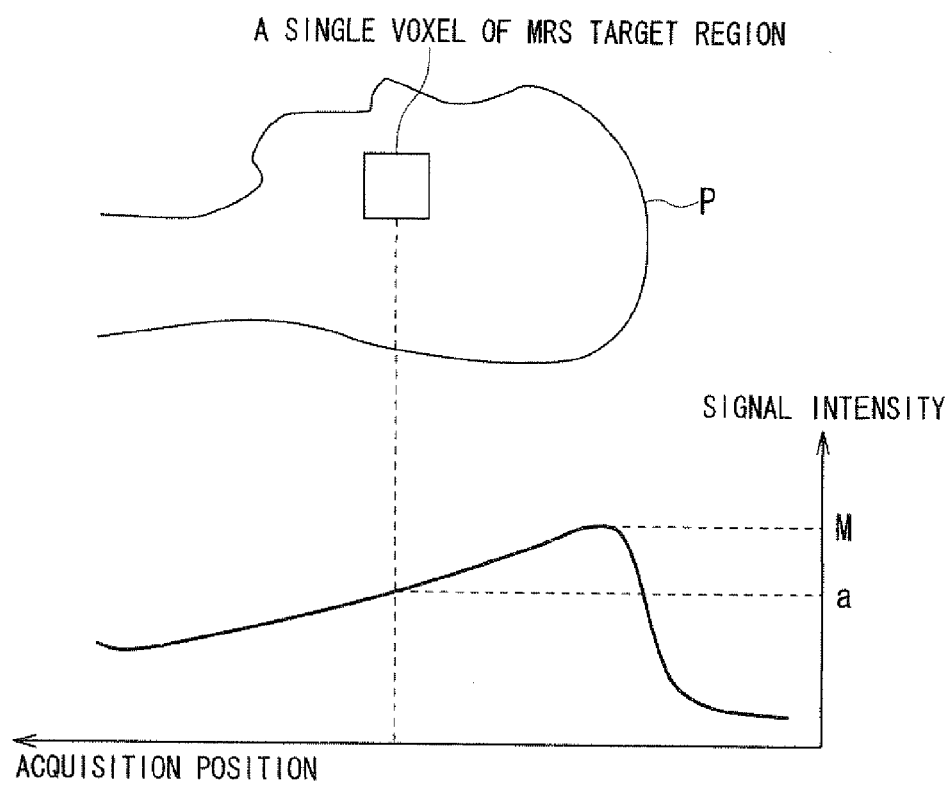
FIG. 12 is a diagram explaining a method for calculating the appropriate number of times of integrations corresponding to a size of a desired MRS target region.

FIG. 12 is a diagram explaining a method for calculating the appropriate number of times of integrations corresponding to a size of a desired MRS target region.

The display unit 34 displays an RF coil sensitivity distribution as shown in FIG. 12, for example, according to the control of the display data generating unit 44. In the RF coil sensitivity distribution in FIG. 12, the highest signal intensity in the entire arbitrary image for the MRS plan is regarded as M and the signal intensity at the MRS acquisition position is regarded as a.

In step S15, the number-of-times-of-integration calculation unit 43 calculates the appropriate number-of-times of integrations of echo signals for generating a spectrum corresponding to the size of the desired MRS target region by a predetermined calculation method based on the retrieved data, including the RF coil sensitivity distribution before MRS imaging.

Now, a method of calculating the appropriate number-of-times of integrations corresponding to the size of the desired MRS target region will be described with reference to FIG. 12. As shown in FIG. 12, for example, the highest signal intensity in the entire arbitrary image used for the MRS plan is regarded as M and the signal intensity at the MRS acquisition position is regarded as a. Then, the appropriate number-of-times of integrations (for multi voxels, a product of the number of the phase encodes and the number-of-times of integrations) X corresponding to the size of the desired MRS target region can be calculated by the expression (1) wherein the voxel size used for the MRS examination is q (cc), a reference voxel size corresponding to the position at which the sensitivity is highest is N (cc) and the reference numberof-times of integrations of echo signals corresponding to the position at which the sensitivity is highest is O.

$$X=(N/q)^2 \times (M/a)^2 \times O \quad (1)$$

The number-of-times-of-integration calculation unit 43 provides the data including the calculated number-of-times of integrations to the sequence controller control unit 41.

Subsequently, in step S16, the sequence controller control unit 41 acquires the data including the number-of-times of integrations provided from the number-of-times-of-integration calculation unit 43, and makes the sequence controller 31 perform an MRS by providing a sequence of $^1$H-MRS in the desired MRS target region (MRS acquisition region) based on the acquired data including the number-of-times of integrations to the sequence controller 31. That is, the sequence controller control unit 41 makes the sequence controller 31 apply radio frequency pulses and gradient magnetic field pulses to the object P in the static magnetic field and acquire magnetic resonance signals from a metabolite present in the object P.

Subsequently, the sequence controller control unit 41 provides the acquired magnetic resonance signals and the number of times of integrations to the display data generating unit 44. The display data generating unit 44 generates a frequency spectrum by integrating the magnetic resonance signals the number of times of integrations. Then, the generated frequency spectrum is displayed on the display unit 34. Thus, a spectrum having a narrow line width with a satisfactory S/N ratio can be acquired by the MRS examination.

By the magnetic resonance imaging apparatus 20 as described above, the appropriate number-of-times of integrations corresponding to a size of a desired MRS target region can be calculated so as to prevent an examination time from increasing unnecessarily for the reason that an actual examination results in failure or an examination time increases unnecessarily by a body motion even when a sensitivity of the RF coil 24 or a susceptibility of an object is not uniform. Therefore, a spectrum can be acquired in the minimum time and a waste of an examination time with MRS can be favorably eliminated.

Note that, in the embodiment of the present invention, the number-of-times of integrations used for acquiring magnetic resonance signals from a metabolite present in an object P is calculated. However, it is not limited to the above-described case. For example, the number of the phase encodes applied for acquiring data for generating a frequency spectrum may be calculated.

Further, the number-of-times-of integrations corresponding to a size of an MRS target region may be calculated based on a magnetic field uniformity distribution generated before MRS imaging, as well as an RF coil sensitivity distribution generated in advance. The second embodiment of the present invention using this method will be described below.

2. Second Embodiment

Figure 13:
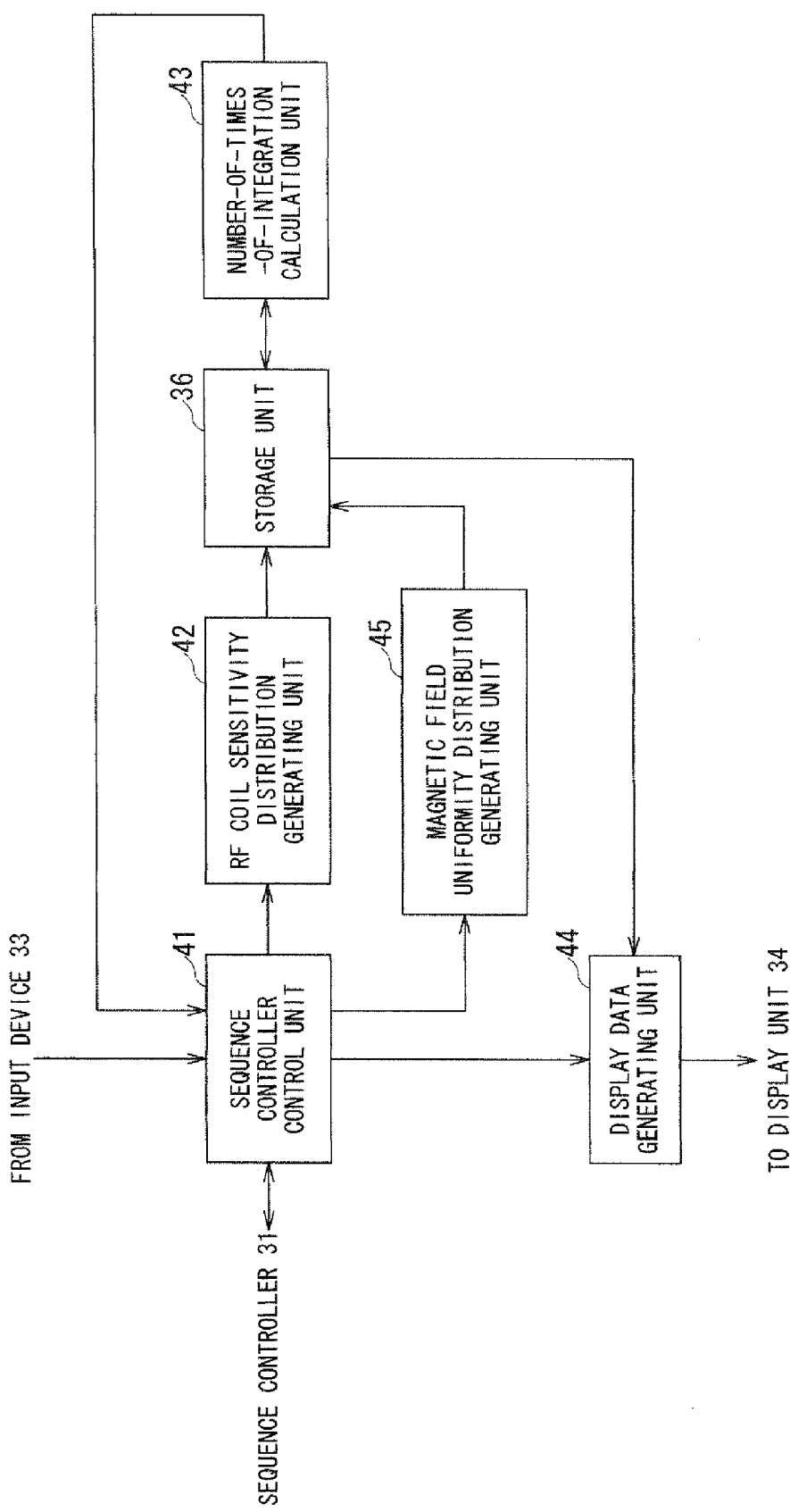
FIG. 13 is a functional block diagram of computer included in a magnetic resonance imaging apparatus according to a second embodiment of the present invention.

FIG. 13 is a functional block diagram of computer included in a magnetic resonance imaging apparatus according to a second embodiment of the present invention.

In FIG. 13, the same signs are attached with the respective elements, corresponding to those of the magnetic resonance imaging apparatus 20 shown in FIG. 7, as those shown in FIG. 7 and descriptions of them are omitted. The basic configurations of the magnetic resonance imaging apparatus is similar to those explained with reference to FIGS. 1 to 6 in the first embodiment of the present invention. Therefore, explanations of them are omitted.

The magnetic field uniformity distribution generating unit 45 acquires data for calculating a magnetic field uniformity provided through the sequence controller control unit 41 from the sequence controller 31, generates a magnetic field uniformity distribution by performing predetermined signal processing of the data for calculating a magnetic field uniformity, and provides data including the generated magnetic field uniformity distribution to the storage unit 36.

Figure 14:
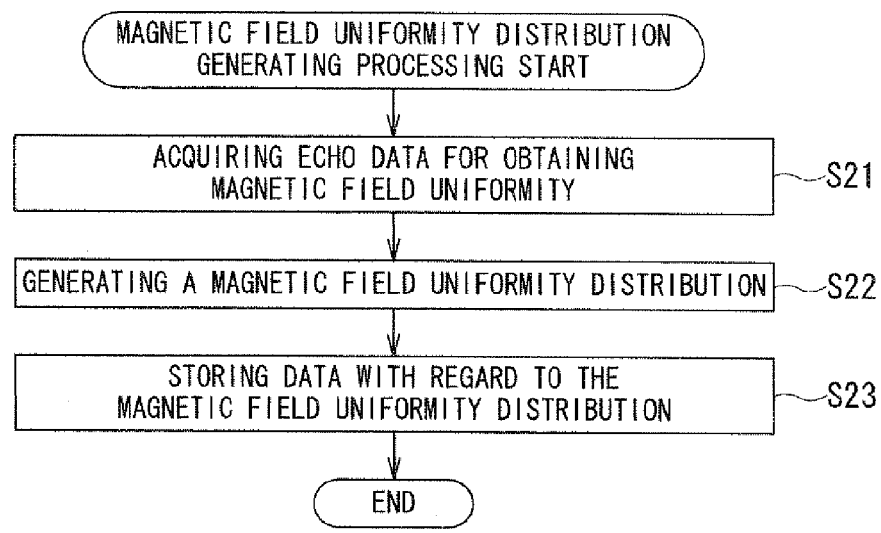
FIG. 14 is a flowchart explaining processing for generating a uniformity distribution of a magnetic field in the magnetic resonance imaging apparatus shown in FIG. 13.

FIG. 14 is a flowchart explaining processing for generating a uniformity distribution of a magnetic field in the magnetic resonance imaging apparatus shown in FIG. 13.

The processing for generating a magnetic field uniformity distribution by the magnetic resonance imaging apparatus 20 in FIG. 13 will be described with reference to the flowchart in FIG. 14.

In step S21, the sequence controller control unit 41 controls the sequence controller 31 to acquire echo data for calculating a magnetic field uniformity before MRS imaging. The sequence controller control unit 41 provides the acquired echo data for calculating a magnetic field uniformity to the magnetic field uniformity distribution generating unit 45.

In step S22, the magnetic field uniformity distribution generating unit 45 acquires the echo data for calculating a magnetic field uniformity provided through the sequence controller control unit 41 from the sequence controller 31, calculates magnetic field uniformities in an entire image by performing known magnetic-field-uniformity-calculation-signal-processing of the echo data for calculating a magnetic field uniformity, and generates a magnetic field uniformity distribution.

For example, the magnetic field uniformity distribution can be calculated by measuring phase shifts of echo data or positional shifts of image data obtained from the echo data, due to magnetic field non-uniformity.

Figure 15:
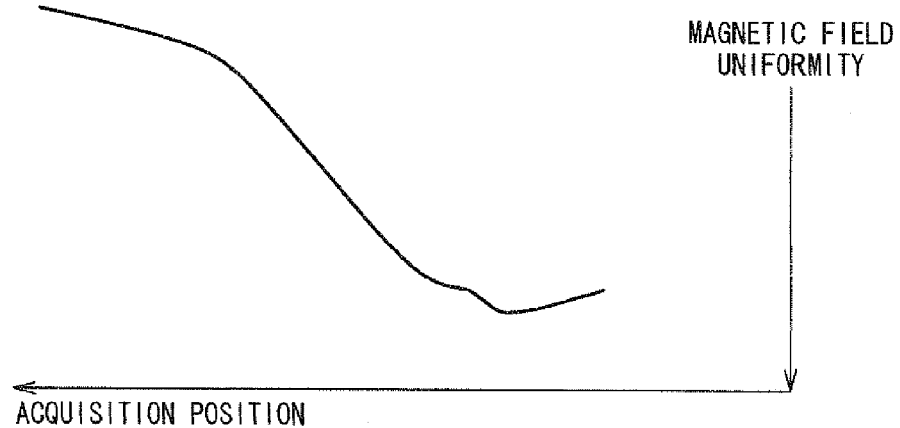
FIG. 15 is a diagram showing a magnetic field uniformity distribution generated by the magnetic field uniformity distribution generating unit shown in FIG. 13.

FIG. 15 is a diagram showing a magnetic field uniformity distribution generated by the magnetic field uniformity distribution generating unit 45 shown in FIG. 13.

As shown in FIG. 15, magnetic field uniformities corresponding to respective acquisition positions are displayed as a graph, for example.

The magnetic field uniformity distribution generating unit 45 provides the generated data including the magnetic field uniformity distribution to the storage unit 36.

In step S23, the storage unit 36 acquires the data including the magnetic field uniformity distribution from the magnetic field uniformity distribution generating unit 45 and stores the acquired data including the magnetic field uniformity distribution. The data including the magnetic field uniformity distribution includes data indicating the magnetic field uniformities corresponding to the respective acquisition positions, for example.

Figure 16:
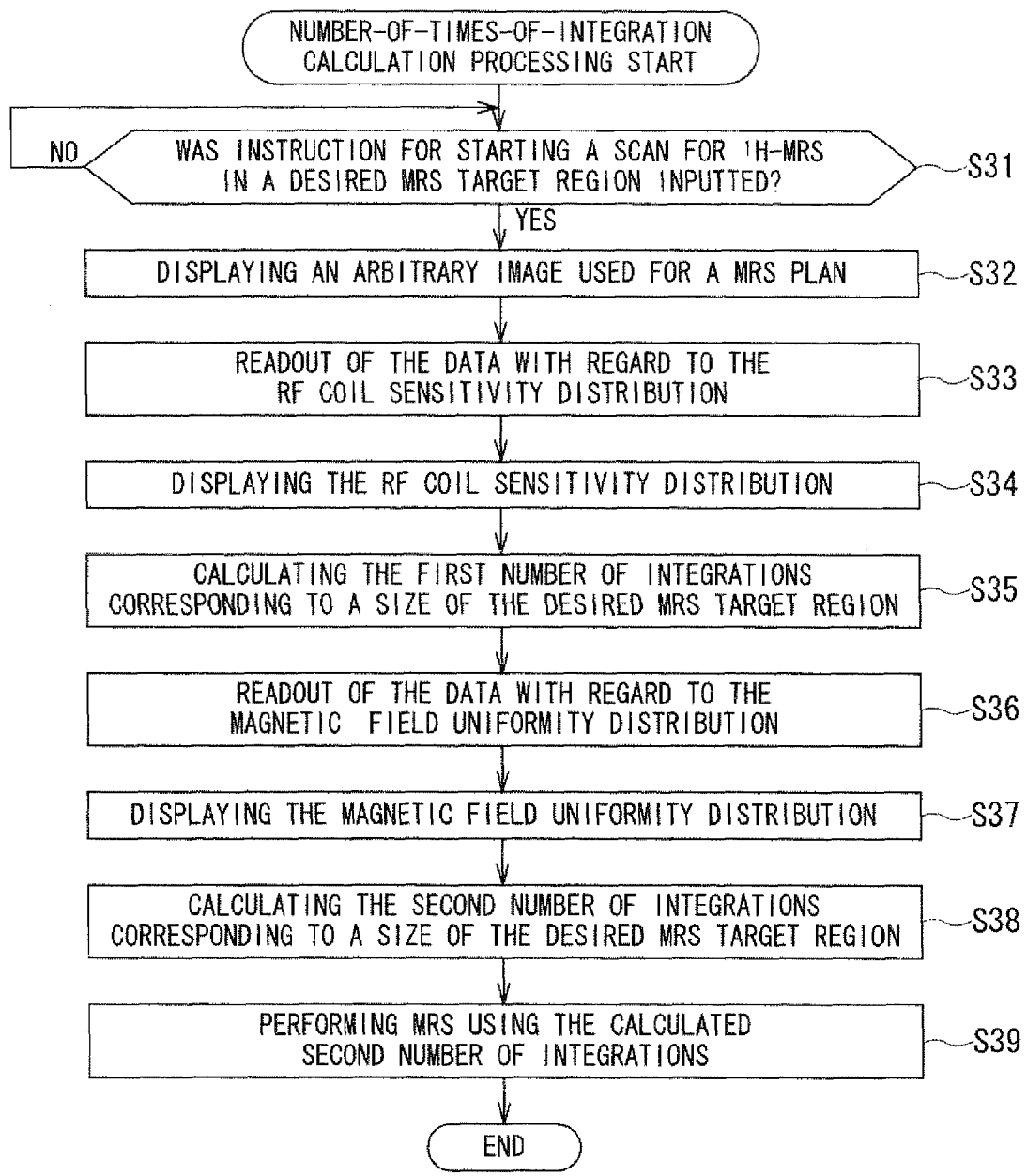
FIG. 16 is a flowchart explaining processing for calculating the number of times of integrations by the number-of-times-of-integration calculating unit shown in FIG. 13.

FIG. 16 is a flowchart explaining processing for calculating the number of times of integrations by the number-of-times-of-integration calculating unit 43 shown in FIG. 13.

The processing for calculating the number of times of integrations by the number-of-times-of-integration calculating unit 43 shown in FIG. 13 will be described referring to the flowchart of FIG. 16. Note that the respective pieces of processing of steps S31 to S35 of FIG. 16 are basically similar to those of steps S11 to S15 in FIG. 10. Therefore, explanations of them are omitted. Note that the first number-of-times-of-integration X corresponding to a desired size of an MRS target region is calculated by processing of step S35.

In step S36, the number-of-times-of-integration calculation unit 43 retrieves the data including the magnetic field uniformity distribution stored in the storage unit 36.

In step S37, the display data generating unit 44 retrieves the data including the magnetic field uniformity distribution stored in the storage unit 36 for calculation processing of the number-of-times of integrations by the number-of-times-of-integration calculation unit 43, and controls the display unit 34 to display the magnetic field uniformity distribution on the display unit 34 based on the retrieved the data including the magnetic field uniformity distribution. That is, the display unit 34 displays the magnetic field uniformity distribution as shown in FIG. 12 according to the control of the display data generating unit 44, for example.

Figure 17:
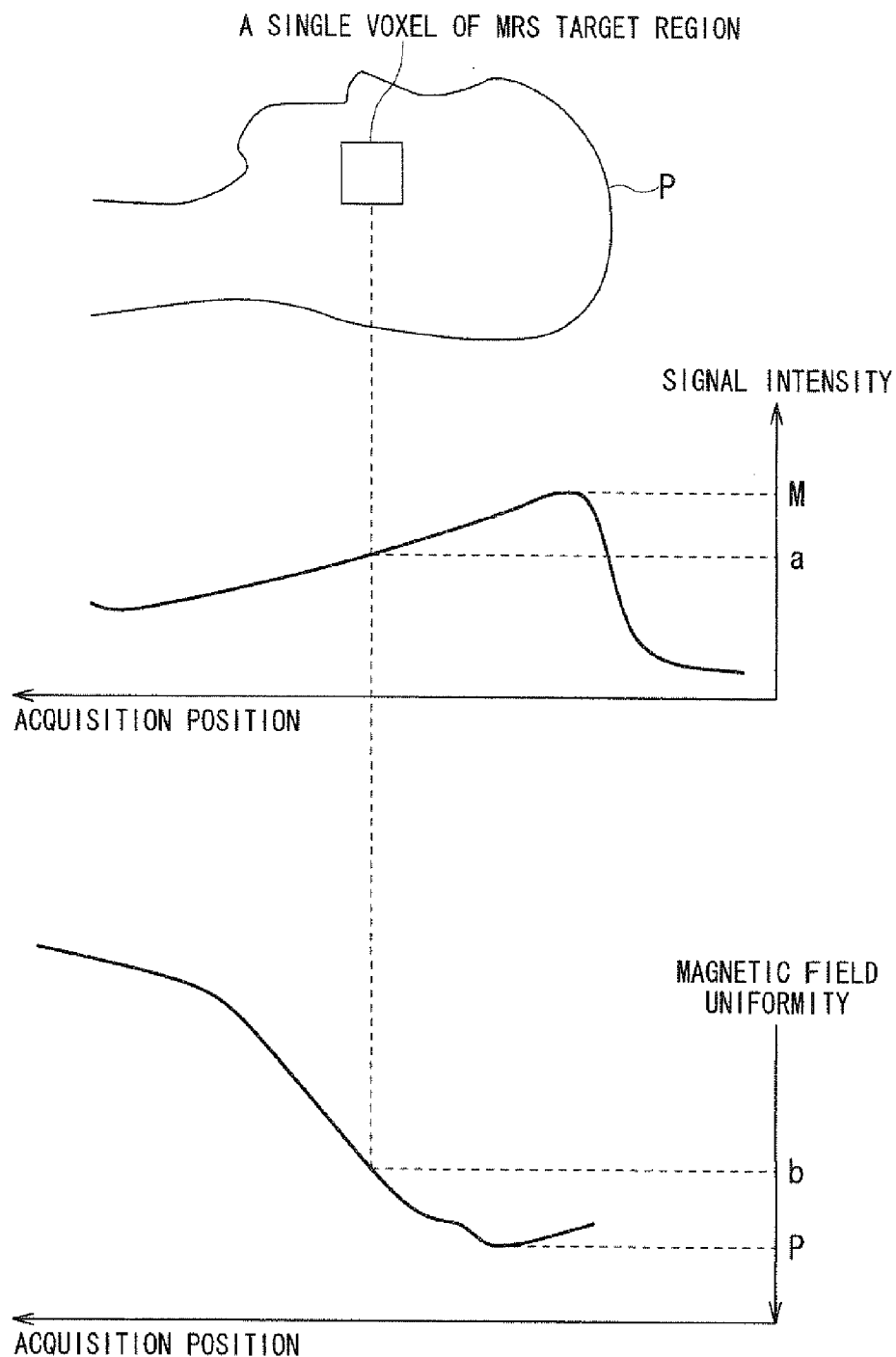
FIG. 17 is a diagram explaining a method for calculating the appropriate number of times of integrations corresponding to a size of a desired MRS target region.

FIG. 17 is a diagram explaining a method for calculating the appropriate number of times of integrations corresponding to a size of a desired MRS target region.

In the magnetic field uniformity distribution in FIG. 17, the highest magnetic field uniformity in the entire arbitrary image used for an MRS plan is regarded as P (ppm) and the magnetic field uniformity at an MRS acquisition position is regarded as b (ppm). When the magnetic field uniformity is poor, a line width of a spectrum increases and a signal intensity decreases since the area is constant.

In step S38, the number-of-times-of-integration calculation unit 43 calculates the second number-of-times of integrations corresponding to the size of the desired MRS target region by a predetermined calculation method based on the retrieved data including the magnetic field uniformity distribution before MRS imaging.

Now, a method of calculating the second number-of-times of integrations corresponding to the size of the desired MRS target region will be described with reference to FIG. 17. As shown in FIG. 17, for example, the highest magnetic field uniformity in the entire arbitrary image used for an MRS plan is regarded as P (ppm) and the magnetic field uniformity at the MRS acquisition position is regarded as b (ppm).

At this time, the second number-of-times of integrations (for multi voxels, a product of the number of the phase encodes and the number-of-times of integrations) Y corresponding to the size of the desired MRS target region can be calculated by the expression (2) using the number-of-times of integrations (the first number-of-times of integration) X calculated as described above.

$$Y=(P/b)^2 \times X \qquad (2)$$

The number-of-times-of-integration calculation unit 43 provides the data including the calculated number-of-times of integrations to the sequence controller control unit 41.

Subsequently, in step S39, the sequence controller control unit 41 acquires the data including the second number-of-times of integrations provided from the number-of-times-of-integration calculation unit 43, provides a sequence of $^1$H-MRS in the desired MRS target region (MRS acquisition region) based on the acquired data including the second number-of-times of integrations to the sequence controller 31 to perform MRS. That is, the sequence controller control unit 41 makes the sequence controller 31 apply radio frequency pulses and gradient magnetic field pulses to an object P in the static magnetic field and acquire magnetic resonance signals from a metabolite present in the object P.

Subsequently, the sequence controller control unit 41 provides the acquired magnetic resonance signals and the number-of-times of integrations to the display data generating unit 44. The display data generating unit 44 generates a frequency spectrum by integrating magnetic resonance signals the number-of-times of integrations. Thus, a spectrum having a narrow line width with a satisfactory S/N ratio can be acquired by an MRS examination.

Note that there is a method for using a line width of a spectrum acquired without water suppression before $^1$H-MRS imaging for acquiring signals from a single region, as a method for using a corrected magnetic field uniformity. In this case, the number-of-times of integrations (for multi voxels, the product of the number of the phase encodes and the number-of-times of integrations) Y' can be calculated by the expression (3) wherein a half value width of a water spectrum corresponding to the highest signal intensity M in the entire arbitrary image used for an MRS plan is S (ppm) and a half value width of the water spectrum of in a desired MRS target region is t (ppm).

$$Y'=(S/t)^2 \times X \qquad (3)$$

The number-of-times of integrations can be calculated using both an RF coil sensitivity distribution and a magnetic field uniformity distribution, or using only a magnetic field uniformity distribution.

That is, the number of times of integrations or the number of times of phase encodes can be set according to a factor or factors, each influencing a frequency spectrum, such as an RF coil sensitivity distribution and/or a magnetic field uniformity distribution. Note that each order in the expressions (1) to (2) may be an arbitrary positive value other than two. Therefore, the number of times of integrations Z can be calculated by the generalized expression (4) or (5).

$$Z=a_1(N/q)^{n1} \cdot a_2(M/a)^{n2} \cdot a_3(P/b)^{n3} \cdot O \qquad (4)$$

$$Z=b_1(N/q)^{m1} \cdot b_2(M/a)^{m2} \cdot b_3(S/t)^{m3} \cdot O \qquad (5)$$

wherein

Z: the number-of-times-of-integration;
N: a reference voxel size;
q: a voxel size of an MRS target region;
M: the maximum signal intensity on a plan image;
a: a signal intensity on a position for MRS acquisition;
P: the maximum value of index representing magnetic field uniformity on the plan image;
b: an index representing magnetic field uniformity on the position for MRS acquisition;
S: a half-value width of a reference water spectrum;
t: a half-value width of a water spectrum on the position for MRS acquisition;
O: the reference number-of-times-of-integration;
$a_1$, $a_2$, $a_3$, $b_1$, $b_2$ and $b_3$ (>0): coefficients; and
n1, n2, n3, m1, m2 and m3: positive values.

The reference voxel size N, the half-value width of a reference water spectrum S and the reference number-of-times-of-integration O can be set to values corresponding to the maximum sensitivity and the maximum magnetic field uniformity. The coefficients $a_1$, $a_2$, $a_3$, $b_1$, $b_2$ and $b_3$ and the positive values n1, n2, n3, m1, m2 and m3 can be set to appropriate values obtained experimentally or experientially. Each of the positive values n1, n2, n3, m1, m2 and m3 can be set to not only an integer such as 0, 1, 2 or 3, but also a value such as ½ or ⅓.

As shown in the expressions (4) and (5), the number of times of integrations Z becomes larger when q, a, b and/or t are relatively smaller to N, M, P and/or S, respectively.

Alternatively, by referring to a table derived by previously relating the appropriate numbers of times of integrations with respective values of each parameter such as a voxel size which influences a frequency spectrum, instead of using a expression like the expression (4) or (5), the number of times of integrations corresponding to values of the respective parameters may be set as one for MRS. In this case, the table can be stored in the storage unit 36.

Note that the number of times of phase encodes can be determined by a similar method.

By the way, while the sequence controller control unit 41 performs an MRS examination, the display unit 34 displays a spectrum derived by the MRS examination according to the control of the display data generating unit 44. Conventionally, processing for displaying a spectrum is performed after MRS acquisition. For this reason, an SNR might be insufficient although the MRS examination was performed. In such a case, to improve the SNR later takes extra time. For that reason, the display data generating unit 44 performs processing for generating and displaying an MRS spectrum to display the MRS spectrum on the display unit 34 during a set MRS observation time according to the control of the sequence controller control unit 41.

Figure 18:
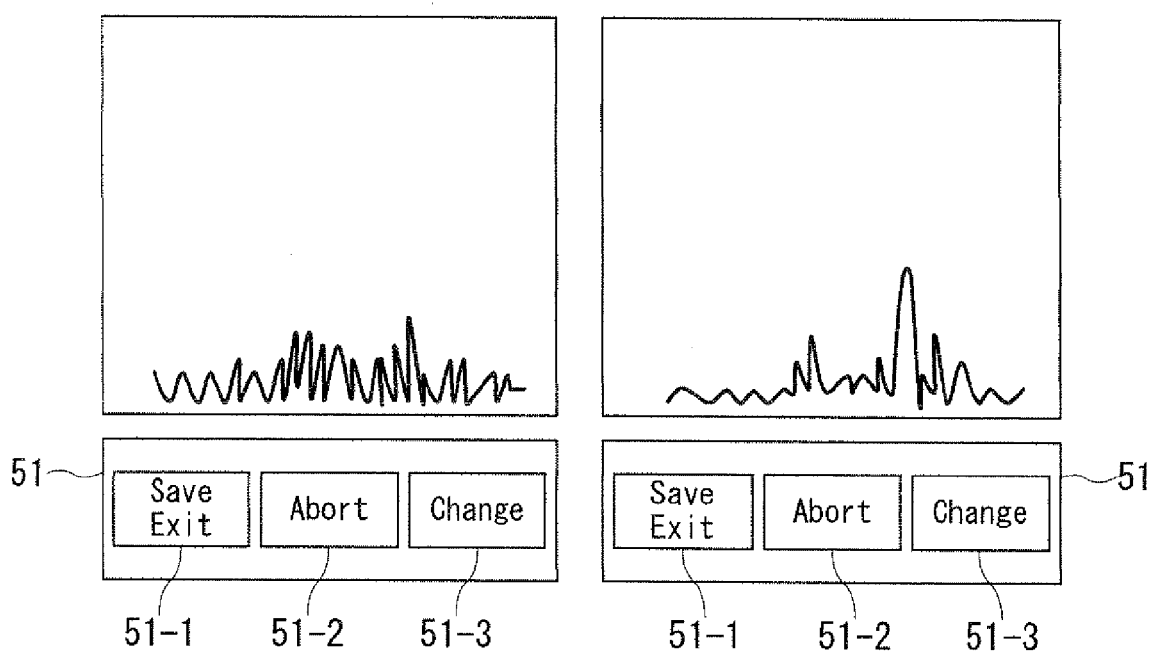
FIG. 18 shows an example of a configuration of a touch panel displayed for acquisition by MRS.

FIG. 18 shows an example of configuration of a touch panel displayed for acquisition by MRS.

FIG. 18(A) shows a spectrum which is being acquired of a single voxel after a lapse of 1 minute, and FIG. 18(B) shows a spectrum which is being acquired of the single voxel after a lapse of 4 minutes.

Of course, processing for displaying a spectrum may be performed per single integration in MRS. In a case of $^1$H-MRS (proton spectroscopy), processing for displaying a spectrum may be performed per multiple-of-eight times of integrations when the spectrum without water suppression is acquired with eight integrations for example.

As shown in FIGS. 18(A) and 18(B), a touch panel 51 as input means can be displayed simultaneously when an MRS spectrum is displayed on the display unit 34. As shown in FIGS. 18(A) and 18(B), for example, the touch panel 51 includes a Save&Exit button 51-1 having the function to quit an imaging on the way and save (store) a spectrum in a case where an SNR is sufficient, an Abort button 51-2 having the function to quit an imaging on the way in a case where a desired spectrum can not be acquired and a Change button 51-3 having the function to change the number-of-times of integrations on the way in a case where the set number-of-times of integrations seems to be insufficient. Therefore, conditions for acquiring a frequency spectrum can be changed on acquisition of the frequency spectrum by operating the touch panel 51.

Accordingly, for example, when an SNR of a spectrum is sufficient during execution of an MRS with the calculated number-of-times of integrations, the MRS imaging can be aborted on the way and data can be saved (stored) in the storage unit 36 with an operation of the Save&Exit button 51-1 by an operator. On the contrary, when a desired spectrum does not seem to be acquired during acquisition, the imaging that does not acquire a desired spectrum can be quit with an operation of the Abort button 51-2 by an operator.

Alternatively, for example, in a case where the set number-of-times of integrations seems to be insufficient during execution of an MRS with the calculated number-of-times of integrations, the number-of-times of integrations can be changed on acquisition of a spectrum with an operation of the Change button 51-3 by an operator. Of course, this change function can be performed after completion of the MRS imaging. Specifically, after completion of the MRS imaging with the number-of-times of integrations (e.g., 128 times) calculated and set according to the flowchart in FIG. 10 or FIG. 16, the number-of-times of integrations can be changed to 192 times so that 64 times data acquisitions are performed additionally, for example. In this case, pieces of data corresponding to 192 integrations are acquired to be processed.

Note that dedicated input buttons can be provided as a part of the input device 33 in place of the touch panel.

The third embodiment of the present invention using this method will be described below.

By the way, it is possible to determine a body motion of an object P per preset number-of-times of integrations based on phase shifts of echo signals derived by acquiring a spectrum of water according to the gradient echo method or the like and also alert an operator that at least one of the phase shifts of the echo signals exceeds a constant amount and excess of the phase shift continues not less than a constant period of time in such a case.

3. Third Embodiment

Figure 19:
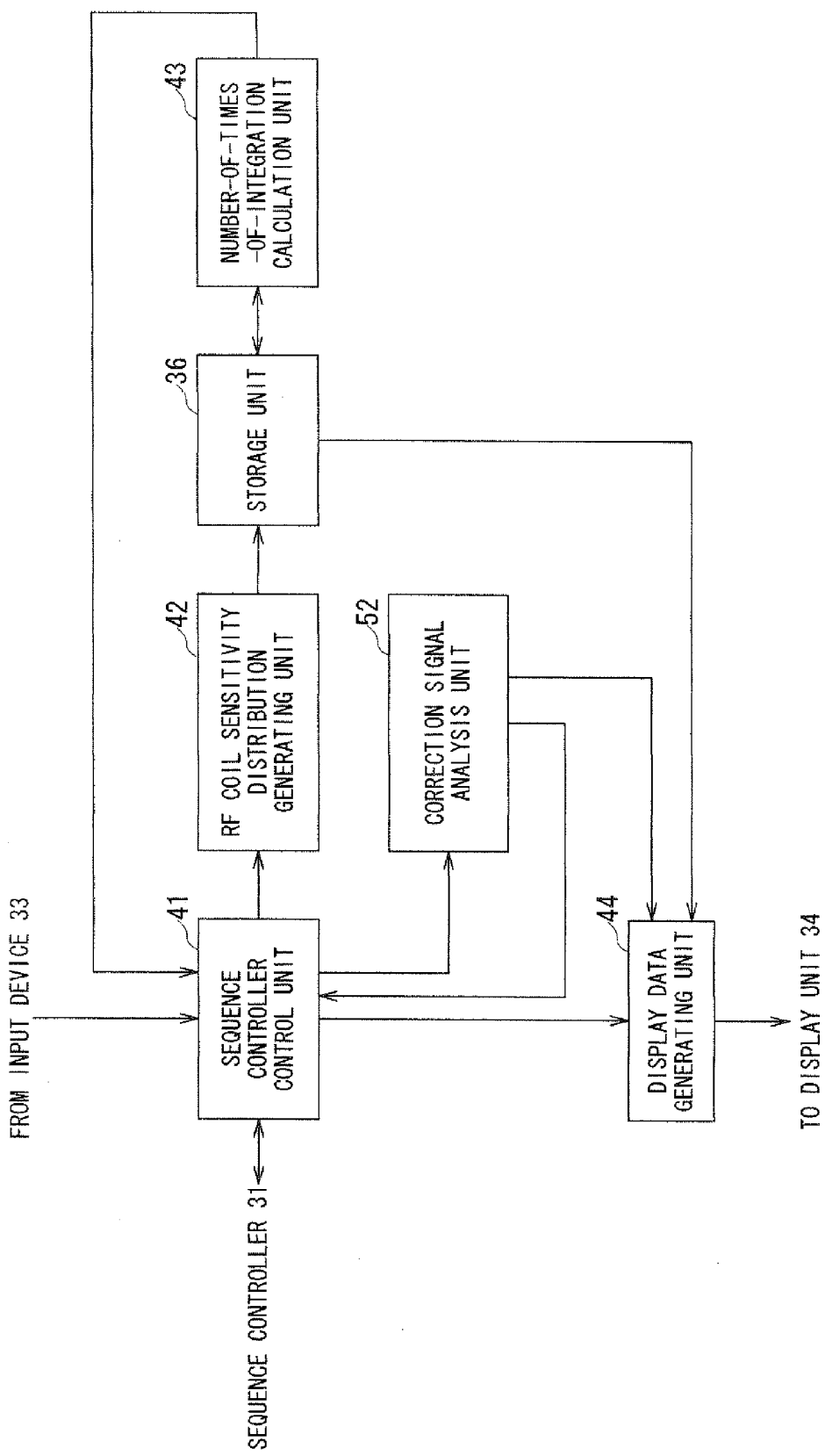
FIG. 19 is a functional block diagram of a computer included in a magnetic resonance imaging apparatus according to a third embodiment of the present invention.

FIG. 19 is a functional block diagram of a computer included in a magnetic resonance imaging apparatus according to a third embodiment of the present invention.

In FIG. 19, the same signs are attached with the respective elements, corresponding to those of the magnetic resonance imaging apparatus 20 shown in FIG. 7, as those shown in FIG. 7 and descriptions of them are omitted. The basic configurations of the magnetic resonance imaging apparatus is similar to those explained with referring to FIGS. 1 to 6 in the first embodiment of the present invention. Therefore, explanations of them are omitted.

The sequence controller control unit 41 makes the sequence controller 31 acquire NMR signals for MRS and correction signals for correcting a spectrum per the preset number-of-times of integrations from a region including at least an MRS target region by the gradient echo.

The correction signal analysis unit 52 acquires the correction signals provided through the sequence controller control unit 41 from the sequence controller 31 per the preset number-of-times of integrations, and also analyzes the acquired correction signals by performing predetermined signal processing of the correction signals. Then, a body motion of an object P can be detected by determining whether each phase shift of the correction signals is not less than a constant amount. When the correction signal analysis unit 52 determines that a phase shift of at least one correction signal is not less than the constant amount as a result of analysis of the correction signals, the correction signal analysis unit 52 recognizes a body motion of the object P and generates a detection signal. The generated detection signal is supplied to the sequence controller control unit 41 and the display data generating unit 44.

Figure 20:
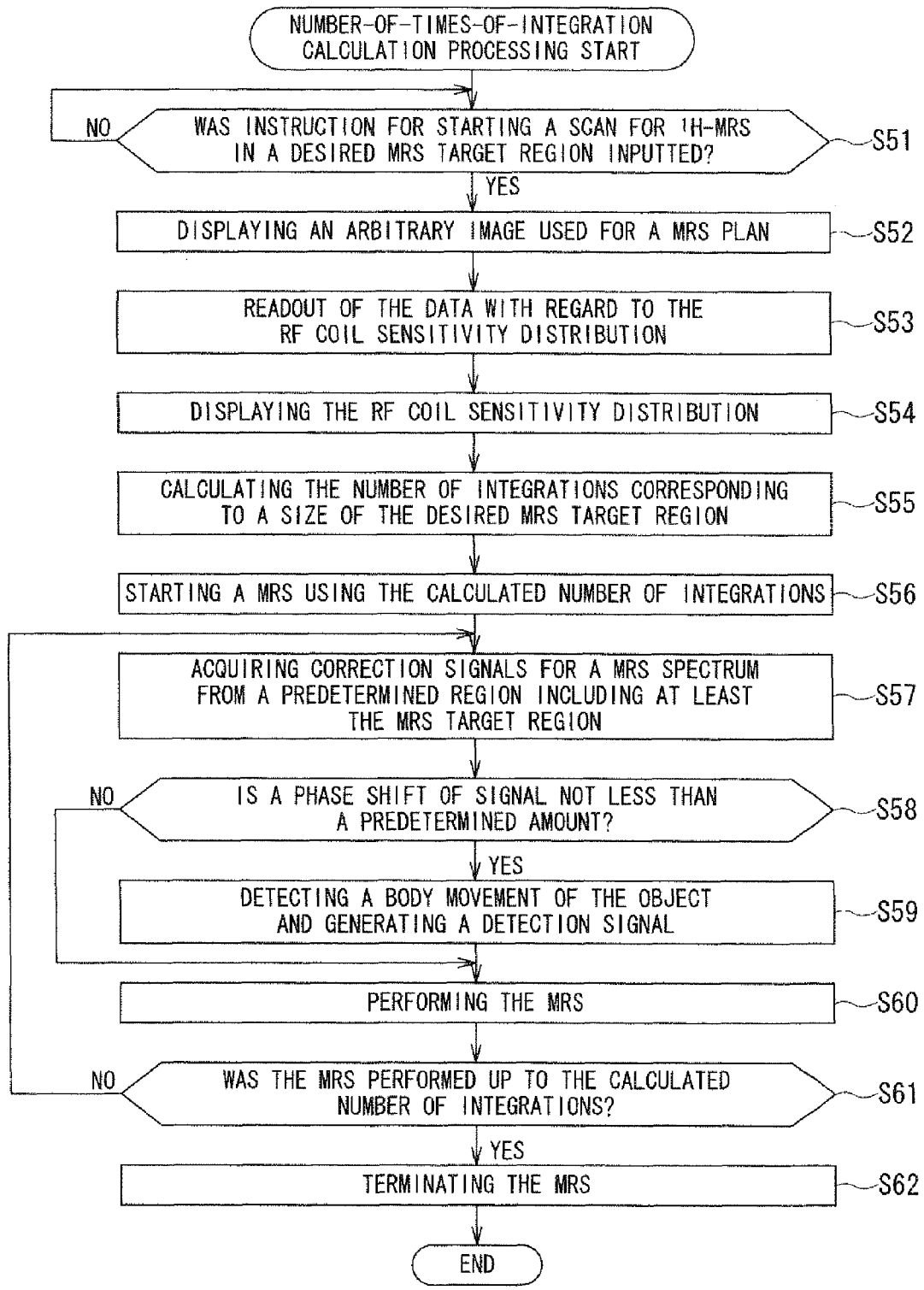
FIG. 20 is a flowchart explaining processing for calculating the number of times of integrations by the number-of-times-of-integration calculating unit shown in FIG. 19.

FIG. 20 is a flowchart explaining processing for calculating the number of times of integrations by the number-of-times-of-integration calculating unit 43 shown in FIG. 19.

The processing for calculating the number of times of integrations by the number-of-times-of-integration calculating unit 43 shown in FIG. 19 will be described referring to the flowchart of FIG. 20. Note that the respective pieces of processing of steps S51 to S55 of FIG. 20 are basically similar to those of steps S11 to S15 of FIG. 10. Therefore, explanations of them are omitted.

In step S56, the sequence controller control unit 41 acquires data including the number-of-times of integrations provided from the number-of-times-of-integration calculation unit 43, and provides a $^1$H-MRS sequence for a desired MRS target region (MRS acquisition region) based on the acquired data including the number-of-times of integrations to the sequence controller 31 so that MRS starts.

Figure 21:
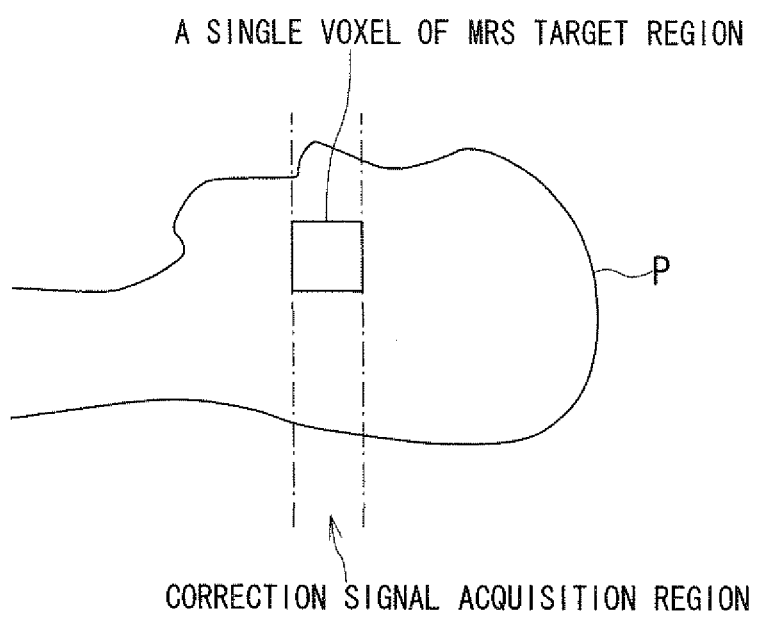
FIG. 21 is a diagram showing a specified region, which includes an MRS target region, for acquiring correction signals.

In step S57, the sequence controller control unit 41 make the sequence controller 31 acquire the correction signals for an MRS spectrum from a predetermined region for correction signal acquisition including at least an MRS target region as shown in FIG. 21 per the preset number-of-times of integrations.

FIG. 21 is a diagram showing a specified region, which includes an MRS target region, for acquiring correction signals.

Note that, in the case of FIG. 21, a cross-section for acquiring data is an axial cross-section. However, the cross-section for acquiring data may be a sagittal section or a coronal section.

In step S58, the correction signal analysis unit 52 acquires the correction signals provided through the sequence controller control unit 41 from the sequence controller 31 per the preset number-of-times of integrations, and also determines whether a phase shift of at least one correction signal is not less than a constant amount by performing predetermined signal processing of the correction signals for analysis.

Figure 22:
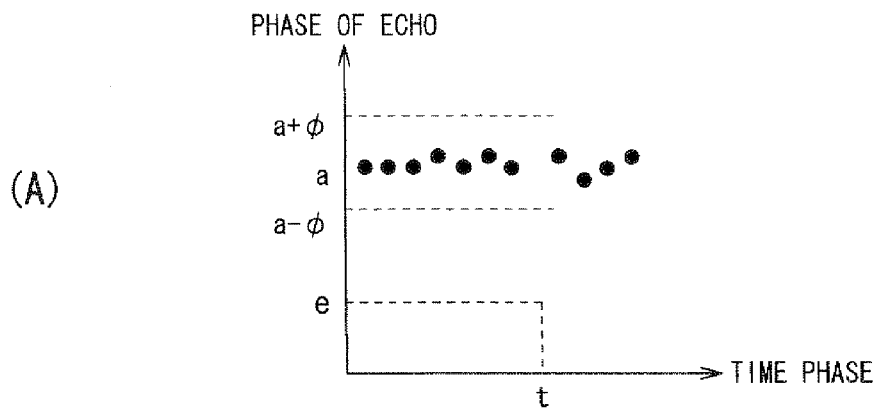
FIG. 22 is a diagram showing a phase shift of correction signal.
Figure 22:
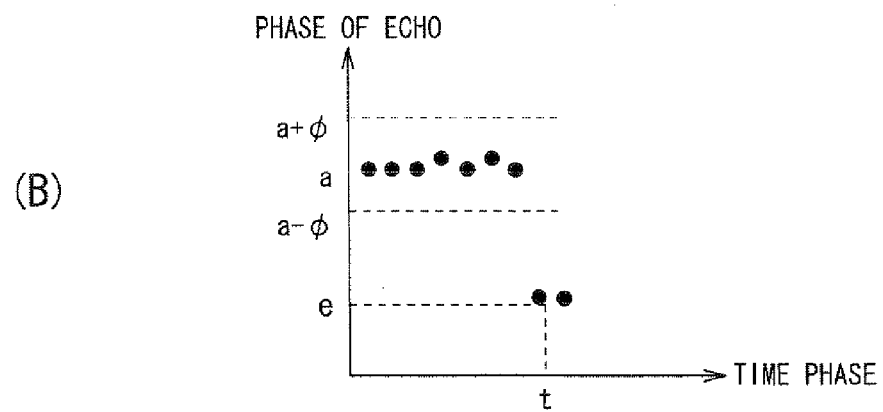

FIG. 22 is a diagram showing a phase shift of a correction signal.

Both FIGS. 22(A) and 22(B) show phase shifts of the correction signals. As shown in FIGS. 22(A) and 22(B), when an initial phase is a and an acceptable range of a phase shift is φ(20° for example), a body motion of an object P occurs at the t-th integration (t-th encode for multi voxels) and a phase deviates to be beyond the acceptable range. Therefore, it is determined that a phase shift of a correction signal is not less than a constant amount in both FIGS. 22(A) and 22(B).

In step S58, when the correction signal analysis unit 52 determines that a phase shift of a correction signal is not less than the constant amount, the correction signal analysis unit 52 detects a body motion of an object P and generates a detection signal according to the body motion of the object P in step S59.

That is, in the case of FIG. 22(A), the phase deviated to be beyond the acceptable range once and subsequently returned to the former phase because the body motion of the object P is instantaneous. For that reason, the correction signal analysis unit 52 generates a detection signal indicating that the data corresponding to the part having moved is to be excluded from processing with continuing the MRS acquisition for the single voxel so that data corresponding to a part having moved should be excluded from processing with continuing MRS acquisition for a single voxel. The generated detection signal is provided to the sequence controller control unit 41. Note that, in the case of MRS for multi voxels, the correction signal analysis unit 52 generates a detection signal indicating that encode data during a body motion of the object P should be reacquired. Then, the generated detection signal is provided to the sequence controller control unit 41.

On the other hand, in the case of FIG. 22(B), a body motion of the object P is not instantaneous and, therefore, the phase does not return to the former phase after the phase deviated to be beyond the acceptable range once. Accordingly, in the case of FIG. 22(B), the body motion of the object P is too large to disregard influence on the MRS examination. For that reason, the correction signal analysis unit 52 generates a detection signal for displaying a message that a body motion of the object P was detected on the display unit 34 and provides the generated detection signal to the display data generating unit 44 so that the message that the body motion of the object P was detected is displayed on the display unit 34.

On the other hand, when the correction signal analysis unit 52 determines that each of the phase shifts of the correction signals is less than the constant amount in step S58, the processing of step S59 is skipped and the correction signal analysis unit 52 does not generate any detection signal.

In step S60, the sequence controller control unit 41 provides a ¹H-MRS sequence for a desired MRS target region (MRS acquisition region) based on the acquired data including the number-of-times of integrations to the sequence controller 31 so that the sequence controller 31 performs an MRS. That is, radio frequency pulses and gradient magnetic field pulses are applied to an object P in a static magnetic field to acquire magnetic resonance signals from a metabolite present in the object P.

Then, in the case of FIG. 22(A), the phase returns to the former phase after the phase deviated to be beyond the acceptable range once because the body motion of the object P was instantaneous. For that reason, the sequence controller control unit 41 excludes data during the body motion from processing with continuing MRS acquisition for a single voxel based on the detection signal provided from the correction signal analysis unit 52. Accordingly, not only a spectrum having narrow line widths can be acquired with a satisfactory S/N ratio by an MRS examination, but also an influence of a body motion of an object P on the MRS examination can be excluded even if the body motion of the object P occurred.

On the other hand, in the case of FIG. 22(B), a body motion of the object P was not instantaneous and, therefore, the phase does not return to the former phase after the phase deviated to be beyond the acceptable range. Consequently, the body motion of the object P is too large to disregard an influence on the MRS examination. For that reason, the display data generating unit 44 controls the display unit 34 so as to display a message indicating that a body motion of the object P was detected on the display unit 34 according to the detection signal provided from the correction signal analysis unit 52. For example, a message such as "a body motion of the object P occurred" is displayed on the display unit 34. This allows an operator to notice that a body motion of the object P occurred during the MRS examination. Then, the operator can quit the MRS examination afterward through an operation of the input device 33. Note that an operator can be informed of a message by voice or with light emitting elements.

In step S61, the sequence controller control unit 41 determines whether MRS was performed up to the calculated number-of-times of integrations. When the sequence controller control unit 41 determines that MRS was performed up to the calculated number-of-times of integrations in step S61, the processing proceeds to step S62. The sequence controller control unit 41 quits the MRS execution in step S62.

On the other hand, in step S61, when the sequence controller control unit 41 determines that MRS has not been performed up to the calculated number-of-times of integrations yet, the sequence controller control unit 41 increments the number-of-times of integrations by 1. Subsequently, the processing returns to step S57, and the processing on and after step S57 is performed repeatedly. This allows the MRS to be performed up to the calculated number-of-times of integrations to acquire data.

The third embodiment of the present invention can not only calculate the appropriate number-of-times of integrations corresponding to a size of a desired MRS target region, but also prevent an examination time from increasing unnecessarily for the reason that an actual examination results in failure by a body motion or an examination time increases unnecessarily even when a sensitivity of an RF coil 24 or a susceptibility of an object is not uniform. In addition, even if a body motion of an object P occurs during an MRS examination, data during the body motion can be excluded from processing and an operator can be informed of a message that the body motion of the object P was detected. Therefore, the waste of the examination time with MRS can be favorably eliminated.

Note that amplitudes (signal intensities) of correction signals can be used instead of phases of correction signals. Alternatively, both amplitudes and phases of correction signals can be used. In the flowchart of FIG. 20, a body motion of an object P is determined per the preset number-of-times of integrations based on phase shifts of echo signals after acquiring a spectrum of water with a method such as the gradient echo method. However, not only this case, but a body motion of an object P can be detected per several integrations (per several encodes for multi voxels), for example.

Figure 23:
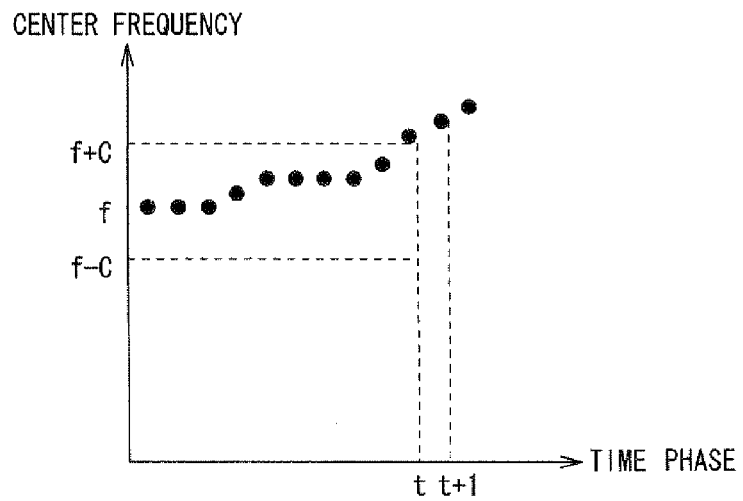
FIG. 23 is a diagram showing a shift in center frequency of correction signal with time.

FIG. 23 is a diagram showing a shift in center frequency of correction signal with time.

As shown in FIG. 23, when an initial center frequency is f and an acceptable range of the center frequency is C (0.1 ppm, for example), the center frequency deviates from the acceptable range due to a change in temperature of a gradient magnetic field system and the like at the t-th integration (in the case of multi voxels, t-th encode).

Figure 24:
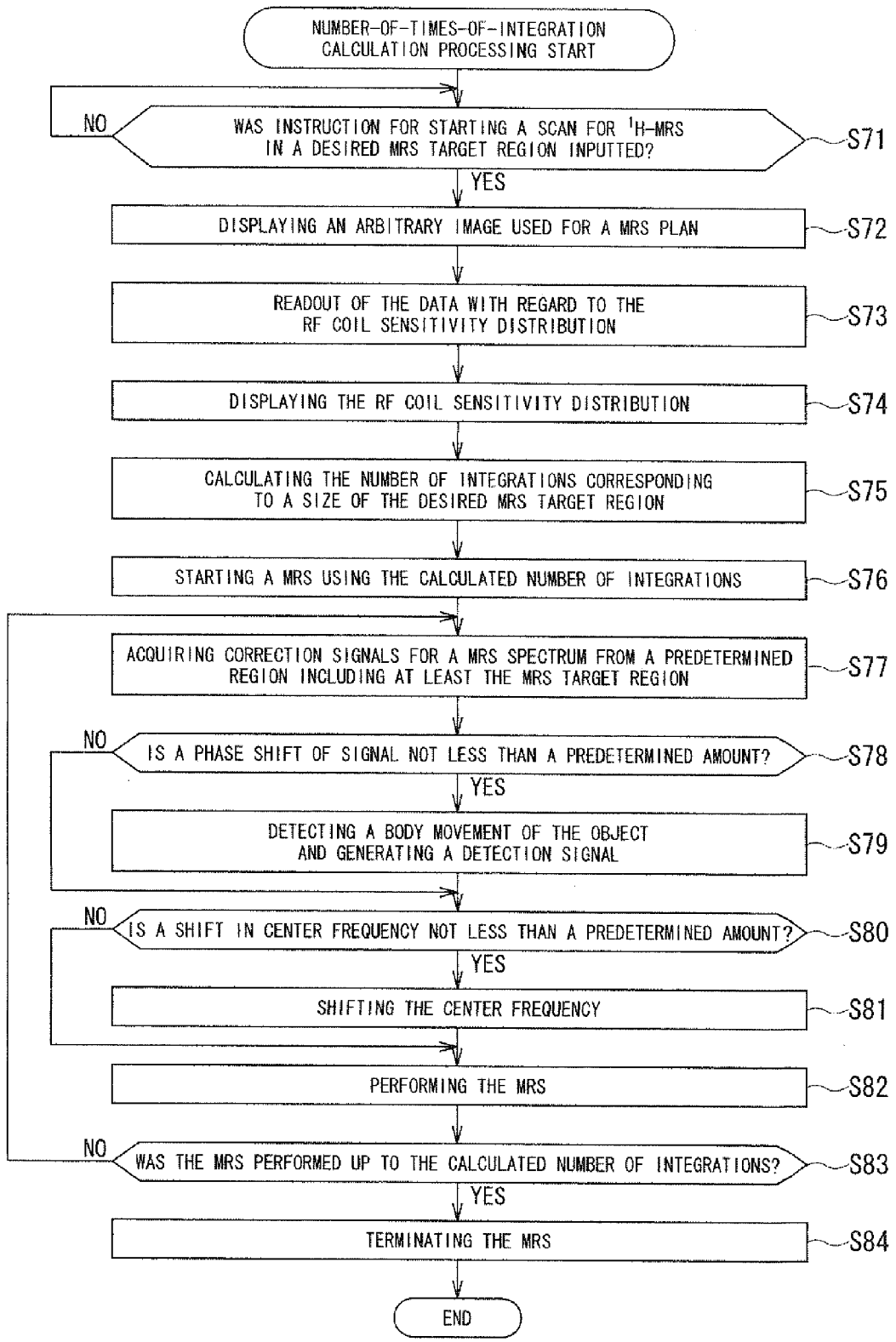
FIG. 24 is a flowchart explaining another processing technique for calculating the number of times of integrations by the number-of-times-of-integration calculating unit shown in FIG. 19.

FIG. 24 is a flowchart explaining another processing technique for calculating the number of times of integrations by the number-of-times-of-integration calculating unit 43 shown in FIG. 19.

As shown in the flowchart in FIG. 24, the correction signal analysis unit 52 determines whether the center frequency exceeds the acceptable range by at least a predetermined amount in step S80. When the correction signal analysis unit 52 determines that the center frequency exceeds the acceptable range by at least the predetermined amount in step S80, the sequence controller control unit 41 performs MRS while shifting the center frequency f to f+C and in step S81. In the case of FIG. 23, for example, the center frequencies for MRS acquisition are shifted to f+C on and after (t+1)-th integration. Accordingly, an MRS examination can be favorably performed even when a gradient magnetic field changes with time.

Note that processing in steps S71 to S79 and steps S82 to S84 in FIG. 24 are basically similar to processing in steps S51 to S62 in FIG. 20. Therefore, a detailed explanation is omitted.

A series of processing described in each embodiment of the present invention can be performed by software or hardware.

In each embodiment of the present invention, an example of processing in which the steps in each flowchart are performed in time series according to the described order is shown. However, the steps may not be processed in time series. That is, the respective steps may be performed in parallel or individually.

What is claimed is:

1. A magnetic resonance imaging apparatus comprising:
    a spectrum acquisition unit configured to acquire a frequency spectrum of magnetic resonance signals from a metabolic product in a target region in an object by applying radio frequency pulses and gradient magnetic field pulses to the object in a static magnetic field; and
    a display unit configured to display the frequency spectrum during acquisition of the frequency spectrum.

2. A magnetic resonance imaging apparatus of claim 1, further comprising:
    an acquisition condition changing unit configured to change an acquisition condition of the frequency spectrum during acquisition of the frequency spectrum.

3. A magnetic resonance imaging apparatus of claim 2, wherein said acquisition condition changing unit includes an input for changing one of (a) the number of times of integrations and (b) the number of times of phase encodes of magnetic resonance signals for obtaining the frequency spectrum.

4. A magnetic resonance imaging apparatus of claim 2, wherein said acquisition condition changing unit includes an input for aborting acquisition of the frequency spectrum.

5. A magnetic resonance imaging apparatus of claim 2, wherein said acquisition condition changing unit includes:
    data storage configured to save the frequency spectrum during acquisition of the frequency spectrum; and
    an input for aborting acquisition of the frequency spectrum.

6. A magnetic resonance imaging apparatus of claim 1, wherein processing for display of the frequency spectrum is performed using a single integration of the magnetic resonance signals.

7. A magnetic resonance imaging apparatus of claim 1, wherein processing for display of the frequency spectrum is performed using multiple integrations of the magnetic resonance signals.

8. A magnetic resonance imaging apparatus of claim 1, wherein processing for acquiring and displaying the frequency spectrum employs integration of the magnetic resonance signals and is aborted by a user operation before the number of integrations of the magnetic resonance signals reaches a predetermined number of times.

9. A magnetic resonance imaging method comprising:
    acquiring a frequency spectrum of magnetic resonance signals from a metabolic product in a target region in an object by applying radio frequency pulses and gradient magnetic field pulses to the object in a static magnetic field; and
    displaying the frequency spectrum during acquisition of the frequency spectrum.

* * * * *